US 011537233B2

(12) United States Patent
Kwon et al.

(10) Patent No.: US 11,537,233 B2
(45) Date of Patent: Dec. 27, 2022

(54) TOUCH DISPLAY DEVICE WITH ROUTING LINES ON AN INCLINED PART OF THE ENCAPSULATION LAYER

(71) Applicant: LG Display Co., Ltd., Seoul (KR)

(72) Inventors: YoungSung Kwon, Seoul (KR); JungWoo Han, Cheongju-si (KR); HongYun Kang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 21 days.

(21) Appl. No.: 17/108,574

(22) Filed: Dec. 1, 2020

(65) Prior Publication Data
US 2021/0181916 A1    Jun. 17, 2021

(30) Foreign Application Priority Data
Dec. 11, 2019  (KR) .................. 10-2019-0164832

(51) Int. Cl.
G06F 3/041    (2006.01)
H01L 27/32    (2006.01)
G01R 31/28    (2006.01)
G06F 11/263   (2006.01)
G06F 3/044    (2006.01)
H01L 51/52    (2006.01)

(52) U.S. Cl.
CPC ..... G06F 3/04164 (2019.05); G01R 31/2829 (2013.01); G06F 3/0412 (2013.01); G06F 11/263 (2013.01); H01L 27/323 (2013.01); H01L 27/3276 (2013.01); G06F 3/044 (2013.01); H01L 27/3244 (2013.01); H01L 51/5253 (2013.01)

(58) Field of Classification Search
CPC .... G06F 3/04164; G06F 3/0412; G06F 3/044; H01L 27/323; H01L 51/5253
See application file for complete search history.

(56) References Cited

U.S. PATENT DOCUMENTS

2017/0315165 A1* 11/2017 Kawaguchi ............... G01L 5/00
2018/0061897 A1*  3/2018 Oh ....................... G06F 3/0412
2018/0329544 A1* 11/2018 Yeh ..................... G06F 3/04164
2019/0057632 A1*  2/2019 Kim ....................... G09G 3/006
2019/0278408 A1*  9/2019 Lee ..................... G06F 3/04164
2019/0294290 A1*  9/2019 Pu .......................... G06F 3/0443
2021/0225216 A1*  7/2021 Wang ..................... G06F 3/0443

FOREIGN PATENT DOCUMENTS

KR    10-2007-0027917 A    3/2007
KR    10-2013-0139511 A    12/2013
KR    10-2019-0047536 A    5/2019

* cited by examiner

Primary Examiner — Liliana Cerullo
(74) Attorney, Agent, or Firm — Seed IP Law Group LLP

(57) ABSTRACT

Embodiments of the present disclosure relate to a touch display device and, more particularly, to a touch display device having a structure capable of enabling efficient testing and reducing the number of test pads.

9 Claims, 20 Drawing Sheets

| Test Group (GR) | Touch Electrodes In Test Group |
|---|---|
| GR_A | A1~A5 |
| GR_B | B1~B5 |
| GR_C | C1~C5 |
| GR_D | D1~D5 |

TOUCH DISPLAY DEVICE WITH ROUTING LINES ON AN INCLINED PART OF THE ENCAPSULATION LAYER

CROSS REFERENCE TO RELATED APPLICATION

This application claims priority from Korean Patent Application No. 10-2019-0164832, filed Dec. 11, 2019, which is hereby incorporated by reference for all purposes as if fully set forth herein.

BACKGROUND

Technical Field

Embodiments of the present disclosure relate to a touch display device.

Description of the Related Art

The advent of the information society has brought growing demand for display devices for displaying images, and various types of display devices, such as a liquid crystal display device, an organic light-emitting display device, and the like, are being utilized.

Further, the display devices include a touch display device that provides a touch-based input function allowing a user to input information or commands easily, intuitively and conveniently in addition to a function of displaying a video or images.

In order to perform touch sensing, a touch display device may include a plurality of touch electrodes, a touch sensing circuit for driving and sensing the touch electrodes, and a plurality of touch routing lines for electrically connecting the plurality of touch electrodes to the touch sensing circuit.

A manufacturing process of the touch display device may include a process of testing whether a touch sensor structure such as a plurality of touch electrodes and a plurality of touch routing lines is normally formed.

BRIEF SUMMARY

The inventors have realized that according to such test process of the conventional art, a great number of test pads for testing must be formed in a panel together with the touch sensor structure such as the plurality of touch electrodes and the plurality of touch routing lines. In addition, the inventors have realized that the number of lines for inputting and outputting a test signal is inevitably increased by as much as the number of test pads, and a test time is also inevitably increased.

Due to these factors, as the number of the touch electrodes and the touch routing lines increases, the structure for testing the touch sensor structure may be more complicated, and the test time may be more increased. Thus, the touch sensor structure test may greatly affect the overall manufacturing time and process of the touch display device. Based on the inventors work in fully locating and appreciating these issues, they have proposed solutions as described herein.

Embodiments of the present disclosure are directed to providing a touch display device capable of enabling efficient testing and reducing the number of test pads.

Embodiments of the present disclosure are also directed to providing a touch display device having a touch sensor structure capable of enabling efficient testing and reducing the number of test pads, and also improving touch sensitivity.

According to an aspect of the present disclosure, there is provided a touch display device including: a substrate; a transistor disposed on the substrate; a pixel electrode connected to a source electrode or a drain electrode of the transistor; a common electrode disposed above the pixel electrode; an encapsulation layer disposed on the common electrode; a plurality of touch electrodes disposed in a first touch sensor metal layer located above the encapsulation layer; a plurality of touch pads disposed in a driving pad area in a non-active area that is an area outside an active area in which an image is displayed; and a plurality of touch routing lines that electrically connect the plurality of touch electrodes to the plurality of touch pads and descend along an inclined surface of the encapsulation layer to extend to the driving pad area while being connected to the plurality of touch electrodes in the active area.

The touch display device according to embodiments of the present disclosure may further include a plurality of outer switches that are disposed further outward than the driving pad area, do not overlap the inclined surface of the encapsulation layer, and include one ends electrically connected to the plurality of touch pads in the driving pad area and the other ends in an electrically floating state.

In the touch display device according to embodiments of the present disclosure, each of the plurality of outer switches may further include an on-off control terminal to which a control voltage, whose voltage level is not varied, is applied.

In the touch display device according to embodiments of the present disclosure, the control voltage may be a turn-off level voltage.

The touch display device according to embodiments of the present disclosure may further include one or more control lines to which the on-off control terminals of the plurality of outer switches are connected.

In the touch display device according to embodiments of the present disclosure, the one or more control lines may be electrically connected to a gate voltage line to which a turn-off level gate voltage for display driving is applied.

According to another aspect of the present disclosure, there is provided a touch display device including: a substrate; a transistor disposed on the substrate; a pixel electrode connected to a source electrode or a drain electrode of the transistor; a common electrode disposed above the pixel electrode; an encapsulation layer disposed on the common electrode; a plurality of touch electrodes located above the encapsulation layer and disposed in an active area; a plurality of touch pads disposed in a driving pad area in a non-active area that is an outer area of the active area; and a plurality of touch routing lines that electrically connect the plurality of touch electrodes to the plurality of touch pads and descend along an inclined surface of the encapsulation layer to extend to the driving pad area while being connected to the plurality of touch electrodes in the active area.

The touch display device according to embodiments of the present disclosure may further include a plurality of outer switches disposed further outward than the driving pad area.

In the touch display device according to embodiments of the present disclosure, the plurality of touch electrodes may be grouped into K test groups, and K may be a natural number of two or more.

The touch display device according to embodiments of the present disclosure may further include K test lines respectively corresponding to the K test groups, and K test pads electrically connected to the K test lines and disposed in a test pad area located further outward than the driving pad area.

In the touch display device according to embodiments of the present disclosure, the plurality of touch pads may include two or more touch pads electrically connected to two or more touch electrodes included in any first test group among the K test groups.

In the touch display device according to embodiments of the present disclosure, one end of each of two or more outer switches among the plurality of outer switches may be electrically connected to each of the two or more touch pads in a corresponding manner, the other end of each of the two or more outer switches among the plurality of outer switches may be electrically connected to a first test line corresponding to the first test group among the K test lines in common, and an on-off control terminal of each of the two or more outer switches among the plurality of outer switches may be electrically connected to a control line in common.

The touch display device according to embodiments of the present disclosure may further include a test switch configured to connect one of a test node to which a turn-on level voltage is applied and a normal node to which a turn-off level voltage is applied to the control line.

In the touch display device according to embodiments of the present disclosure, when a test start event for the two or more touch electrodes included in the first test group is generated, the test node may be connected to the control line by the test switch, and the turn-on level voltage may be applied to an on-off control terminal (a gate node) of each of the two or more outer switches.

In the touch display device according to embodiments of the present disclosure, when a test end event for the two or more touch electrodes included in the first test group is generated, the normal node may be connected to the control line by the test switch, and the turn-off level voltage may be applied to an on-off control terminal (a gate node) of each of the two or more outer switches.

Advantageous Effects

According to embodiments of the present disclosure, it is possible to provide a touch display device capable of enabling efficient testing and reducing the number of test pads.

According to embodiments of the present disclosure, it is possible to provide a touch display device having a touch sensor structure capable of enabling efficient testing and reducing the number of test pads, and also improving touch sensitivity.

Other technical benefits would be readily apparent to a person skilled in the art beyond those mentioned herein.

BRIEF DESCRIPTION OF THE SEVERAL VIEWS OF THE DRAWINGS

The above and other objects, features, and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
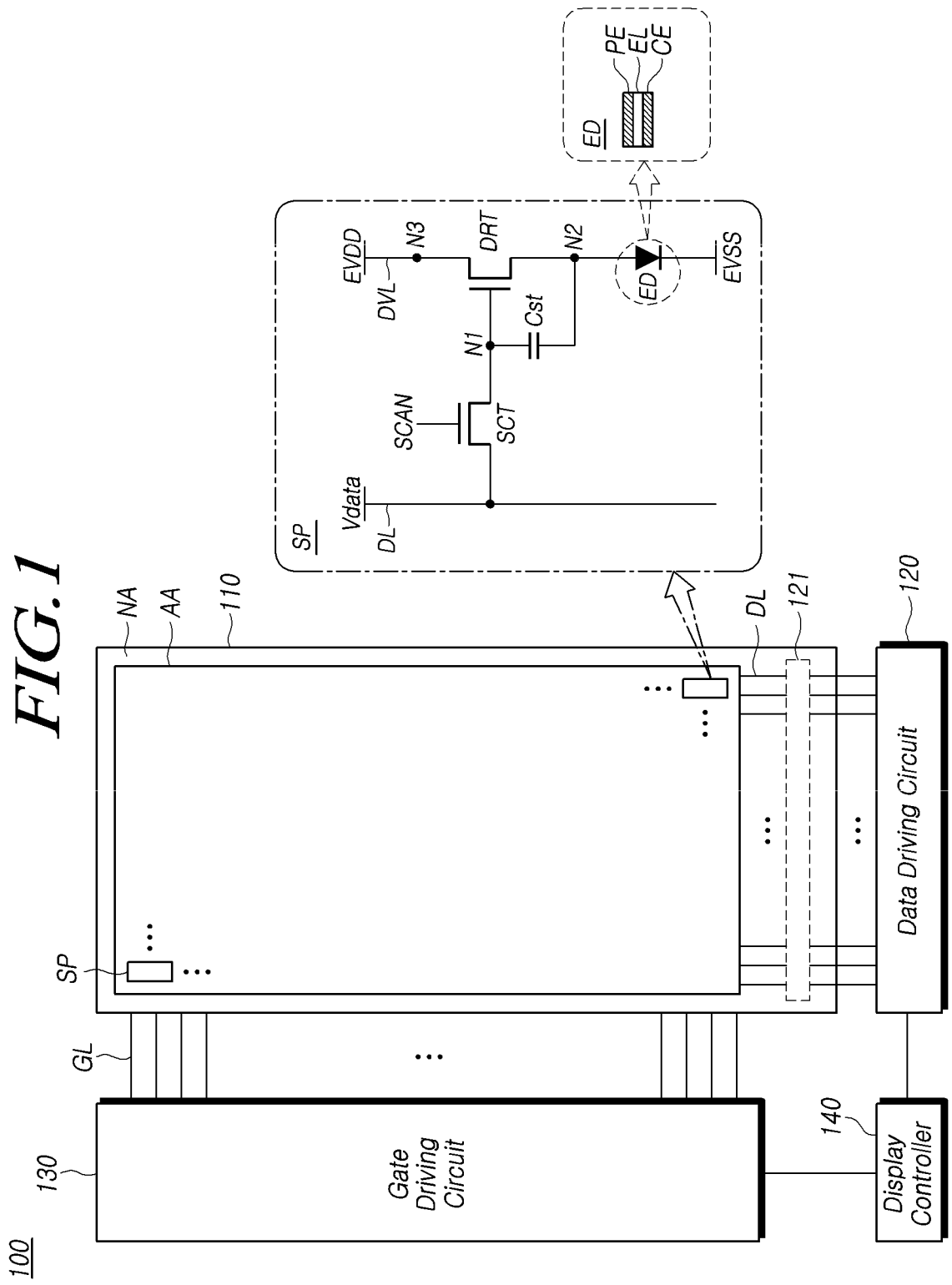
FIG. 1 is a block diagram illustrating a touch display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting," "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc., are mentioned, it should be considered that numerical values for elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

FIG. 1 is a block diagram illustrating a touch display device 100 according to embodiments of the present disclosure.

Referring to FIG. 1, the touch display device 100 according to the embodiments of the present disclosure may include a display panel 110 including a plurality of data lines DL, a plurality of gate lines GL, and a plurality of sub-pixels SP disposed therein, a data driving circuit 120 configured to drive the plurality of data lines DL, a gate driving circuit 130 configured to drive the plurality of gate lines GL, a display controller 140 configured to control the data driving circuit 120 and the gate driving circuit 130, and the like.

The data driving circuit 120 may supply image data voltages Vdata to the plurality of data lines DL depending on the timing control of the display controller 140.

The gate driving circuit 130 may sequentially supply scan signals SCAN to the plurality of gate lines GL depending on the timing control of the display controller 140.

The display panel 110 may include an active area AA in which an image is displayed, and a non-active area NA in which an image is not displayed. The non-active area NA that is adjacent to the active area AA is also referred to as a bezel area. The non-active area NA or a case portion covering the same may or may not be visible from the front of the touch display device 100.

The plurality of data lines DL disposed in the active area AA of the display panel 110 are electrically connected to a plurality of data pads disposed in a driving pad area 121 located in the non-active area NA of the display panel 110.

The data driving circuit 120 may be electrically connected to the plurality of data pads disposed in the driving pad area 121.

The data driving circuit 120 may be implemented in a chip-on-film (COF) type and mounted on a circuit film bonded to the driving pad area 121 of the display panel 110. Alternatively, the data driving circuit 120 may be implemented in a chip-on-glass (COG) type or chip-on-panel (COP) type and directly mounted in the driving pad area 121 of the display panel 110.

The gate driving circuit 130 may be implemented in a COF type and mounted on a circuit film electrically connected to the display panel 110. Alternatively, the gate driving circuit 130 may be implemented in a COG type or COP type and mounted in the non-active area NA of the display panel 110. In this case, the gate driving circuit 130 is called a COG type or COP type. Alternatively, the gate driving circuit 130 may be implemented in a gate-in-panel (GIP) type and formed in the non-active area NA of the display panel 110.

The touch display device 100 according to the embodiments of the present disclosure may be a liquid crystal display (LCD) device including a backlight unit, or a self-emissive display such as an organic light-emitting diode (OLED) display, a quantum dot display, a micro light-emitting diode (LED) display.

In the case that the touch display device 100 according to the embodiments of the present disclosure is a self-emissive display, each of the sub-pixels SP may include a light-emitting element ED that emits light by itself.

In the case that the touch display device 100 according to the embodiments of the present disclosure is an OLED display, each of the sub-pixels SP may include an OLED, emitting light by itself, as a light-emitting element. In the case that the touch display device 100 according to the embodiments of the present disclosure is a quantum dot display, each of the sub-pixels SP may include a light-emitting element made of a quantum dot that is a semiconductor crystal, emitting light by itself. In the case that the touch display device 100 according to the embodiments of the present disclosure is a micro LED display, each of the sub-pixels SP may include a micro LED, which emits light by itself and is made based on an inorganic material, as a light-emitting element.

Referring to FIG. 1, in the touch display device 100 according to the embodiments of the present disclosure, each of the sub-pixels SP may include the light-emitting element ED, a driving transistor DRT configured to control a current flowing to the light-emitting element ED, a scan transistor SCT configured to transfer an image data voltage Vdata to the driving transistor DRT, a storage capacitor Cst configured to maintain a voltage for a predetermined period of time, and the like.

The light-emitting element ED includes a pixel electrode PE, a common electrode CE, and a light-emitting layer EL located between the pixel electrode PE and the common electrode CE. As an example, the light-emitting element ED may be an OLED, an LED, a quantum dot light-emitting element, or the like.

In the light-emitting element ED, the pixel electrode PE may be an anode, and the common electrode CE may be a cathode. A base voltage EVSS may be applied to the common electrode CE of the light-emitting element ED. Here, the base voltage EVSS may be, as an example, a ground voltage or a voltage similar to the ground voltage.

The driving transistor DRT is a transistor for driving the light-emitting element ED and includes a first node N1, a second node N2, and a third node N3.

The first node N1 of the driving transistor DRT is a node corresponding to a gate node, and may be electrically connected to a source node or a drain node of the scan transistor SCT. In the driving transistor DRT, the second node N2 may be electrically connected to the pixel electrode PE of the light-emitting element ED and may be a source node or a drain node. In the driving transistor DRT, the third node N3 is a node to which a driving voltage EVDD is applied, and may be electrically connected to a driving voltage line DVL through which the driving voltage EVDD is supplied, and may be a drain node or a source node.

The scan transistor SCT may control the connection between the first node N1 of the driving transistor DRT and the corresponding data line DL in response to the scan signal SCAN supplied through the gate line GL.

The drain node or the source node of the scan transistor SCT may be electrically connected to the corresponding data line DL. The source node or the drain node of the scan transistor SCT may be electrically connected to the first node N1 of the driving transistor DRT. The gate node of the scan transistor SCT may be electrically connected to the gate line GL to receive the scan signal SCAN.

The scan transistor SCT is turned on in response to the scan signal SCAN of a turn-on level gate voltage and is turned off in response to the scan signal SCAN of a turn-off level gate voltage. Here, in the case that the scan transistor SCT is an n-type, the turn-on level gate voltage may be a high-level gate voltage VGH, and the turn-off level gate voltage may be a low-level gate voltage VGL. In the case that the scan transistor SCT is a p-type, the turn-on level gate voltage may be a low-level gate voltage VGL, and the turn-off level gate voltage may be a high-level gate voltage VGH.

The scan transistor SCT may be turned on in response to the scan signal SCAN of a turn-on level gate voltage to transfer the image data voltage Vdata, supplied through the corresponding data line DL, to the first node N1 of the driving transistor DRT.

The storage capacitor Cst may be electrically connected between the first node N1 and the second node N2 of the driving transistor DRT and maintain the image data voltage Vdata corresponding to an image signal voltage or the voltage corresponding thereto the image data voltage Vdata for one-frame period.

The storage capacitor Cst may be an external capacitor, which is, in one embodiment, intentionally designed outside the driving transistor DRT, rather than a parasitic capacitor (e.g., Cgs or Cgd), which is an internal capacitor present between the first node N1 and the second node N2 of the driving transistor DRT.

Each of the driving transistor DRT and the scan transistor SCT may be an n-type transistor or a p-type transistor. The driving transistor DRT and the scan transistor SCT may both be an n-type transistor or a p-type transistor. At least one of the driving transistor DRT and the scan transistor SCT may be an n-type transistor (or a p-type transistor) and the other one may be a p-type transistor (or an n-type transistor).

The structure of the sub-pixel SP illustrated in FIG. 1 is only an example for the description, and may further include one or more transistors, and in some cases, one or more capacitors. Alternatively, each of the plurality of sub-pixels SP may have the same structure, or some of the plurality of sub-pixels SP may have another structure.

Figure 2:
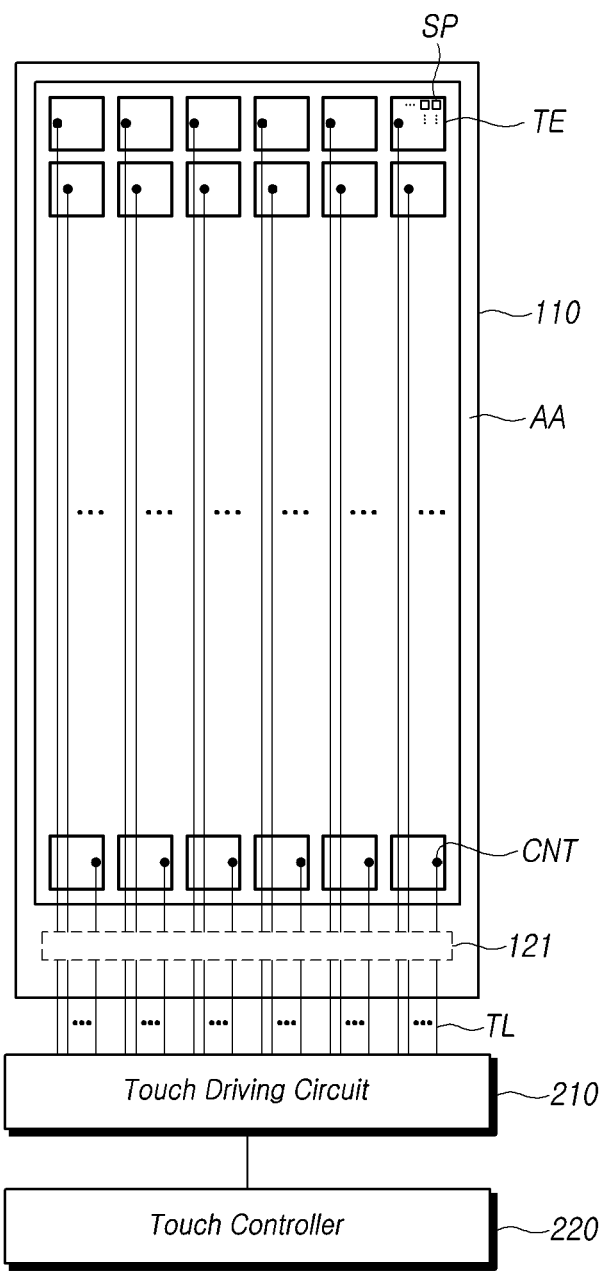
FIG. 2 is a view illustrating touch sensing configuration of the touch display device according to embodiments of the present disclosure.

FIG. 2 is a view illustrating touch sensing configuration of the touch display device 100 according to the embodiments of the present disclosure.

Referring to FIG. 2, the touch display device 100 according to the embodiments of the present disclosure may include a plurality of touch electrodes TE, a touch driving circuit 210 configured to drive and sense the plurality of touch electrodes TE, a touch controller 220 configured to determine the presence of a touch and/or touch coordinates based on the sensing result from the touch driving circuit 210, and the like in order to perform touch sensing.

The plurality of touch electrodes TE may be disposed in the display panel 110. The plurality of touch electrodes TE may be disposed in an area in which touch sensing is possible in the display panel 110.

In the touch display device 100 according to the embodiments of the present disclosure, the plurality of touch electrodes TE are disposed inside the display panel 110. That is, when display-related patterns such as the data lines DL, the gate lines GL, the transistors, and the like are formed during manufacture of the display panel 110, the plurality of touch electrodes TE may also be formed.

The area in which the touch sensing is possible and the active area AA may be the same or different from each other. Hereinafter, for convenience of description, it is assumed that the area in which the touch sensing is possible is the same or substantially the same as the active area AA.

The plurality of touch electrodes TE disposed in the active area AA may be electrodes separated from each other and blocked. Accordingly, the plurality of touch electrodes TE do not overlap each other.

Each of the plurality of touch electrodes TE may be electrically connected to the touch driving circuit 210 through one or more touch routing lines TL. A plurality of touch pads may be disposed in the driving pad area 121 in the non-active area NA of the display panel 110.

The touch driving circuit 210 may be electrically connected to the plurality of touch pads disposed in the driving pad area 121.

The plurality of touch routing lines TL may electrically connect the plurality of touch electrodes TE to the plurality of touch pads in a corresponding manner. That is, in each of the plurality of touch routing lines TL, one end is electrically connected to the corresponding touch electrode TE, and the other end is electrically connected to the corresponding touch pad.

The touch routing lines TL may be disposed to be parallel to or in the same direction as the data lines DL. Alternatively, the touch routing lines TL may be disposed to be parallel to or in the same direction as the gate lines GL.

The plurality of touch electrodes TE may include a first touch electrode and a second touch electrode that are disposed in the same column. It is assumed that the first touch electrode is located farther from the touch driving circuit 210 than the second touch electrode. The plurality of touch routing lines TL may include a first touch routing line connected to the first touch electrode and a second touch routing line connected to the second touch electrode.

The first touch routing line connected to the first touch electrode overlaps the second touch electrode but is not electrically connected to the second touch electrode.

The first touch electrode and the second touch electrode are separated from each other and physically spaced apart from each other in the display panel 110. The first touch routing line and the second touch routing line are separated from each other and physically spaced apart from each other in the display panel 110. The first touch electrode and the second touch electrode are separated from each other in the display panel 110, but may be electrically connected to each other by a switching circuit (a multiplexer circuit) in the touch driving circuit 210 depending on a driving situation.

The display panel 110 may include a plurality of display column lines and a plurality of display row lines for display driving. In an example, the display column lines may be the data lines DL, and the display row lines may be the gate lines GL. In another example, the display column line may be the gate lines GL, and the display row lines may be the data lines DL.

The plurality of touch electrodes TE include a first touch electrode and a second touch electrode disposed in the same touch electrode column. Two or more display column lines overlapping the first touch electrode may be the same as two or more display column lines overlapping the second touch electrode.

Two or more display row lines overlapping the first touch electrode may be different from two or more display row lines overlapping the second touch electrode.

The touch driving circuit 210 may determine the presence of a touch and/or touch coordinates based on a self-capacitance between the touch electrode TE and a touch pointer (e.g., a finger, a pen, or the like.) or a change in the self-capacitance.

The touch driving circuit 210 may supply a touch driving signal to each of the plurality of touch electrodes TE, detect a touch sensing signal from the touch electrode TE to which the touch driving signal is applied, and obtain a sensing value for each touch electrode TE, thereby generating touch sensing data. For example, the touch driving circuit 210 may include a charge amplifier, an integrator, an analog-to-digital converter (ADC), and the like.

The touch controller 220 may determine the presence of a touch and/or touch coordinates based on the touch sensing data.

Figure 3A:
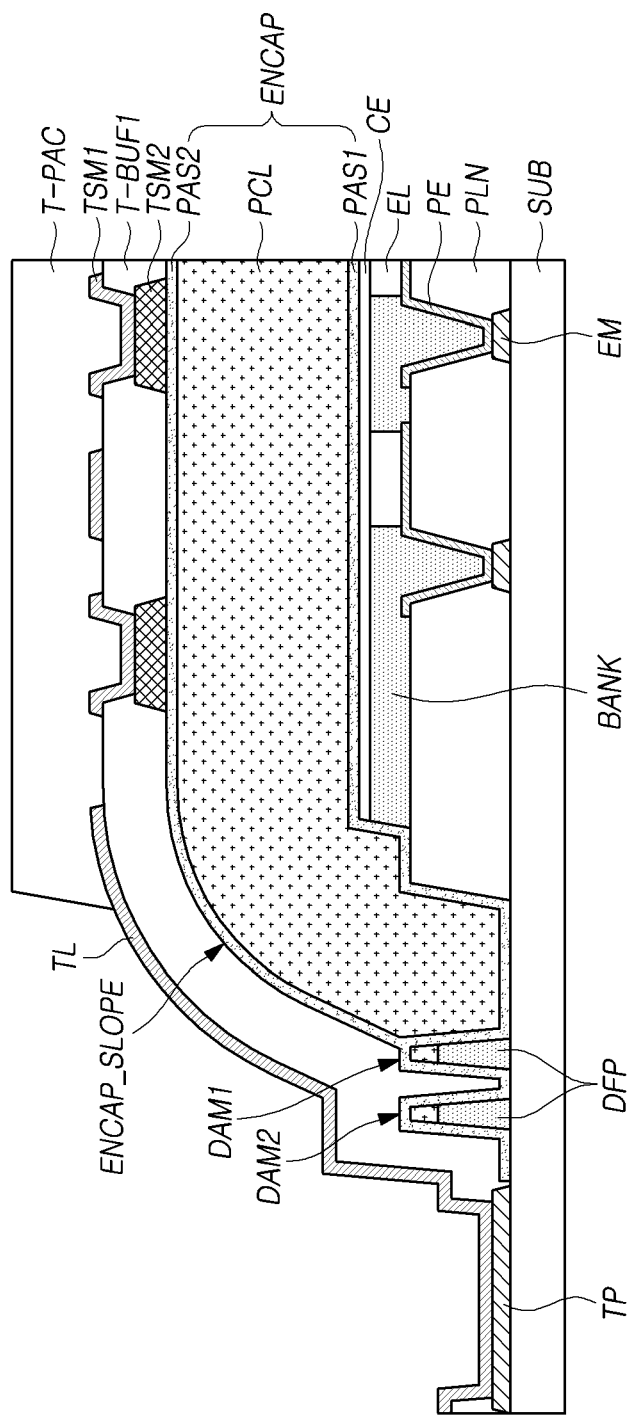
FIGS. 3A, 3B, and 3C are cross-sectional views of the touch display device according to embodiments of the present disclosure.
Figure 3B:
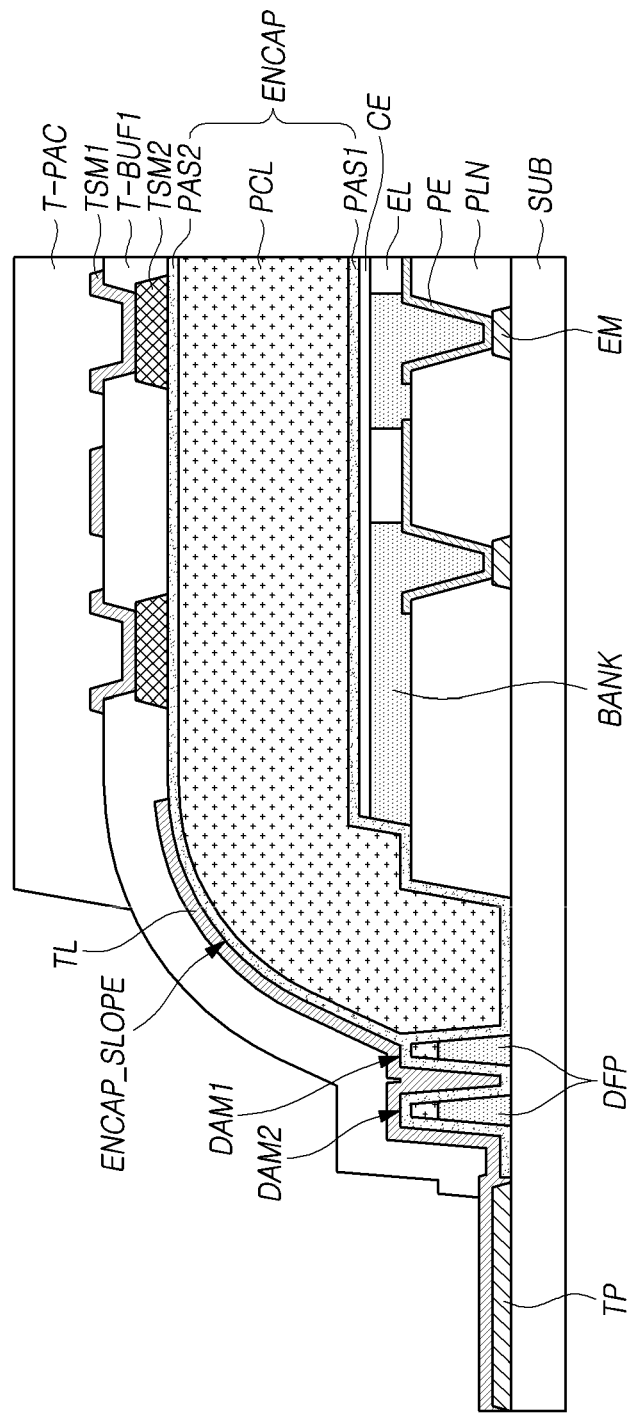
Figure 3C:
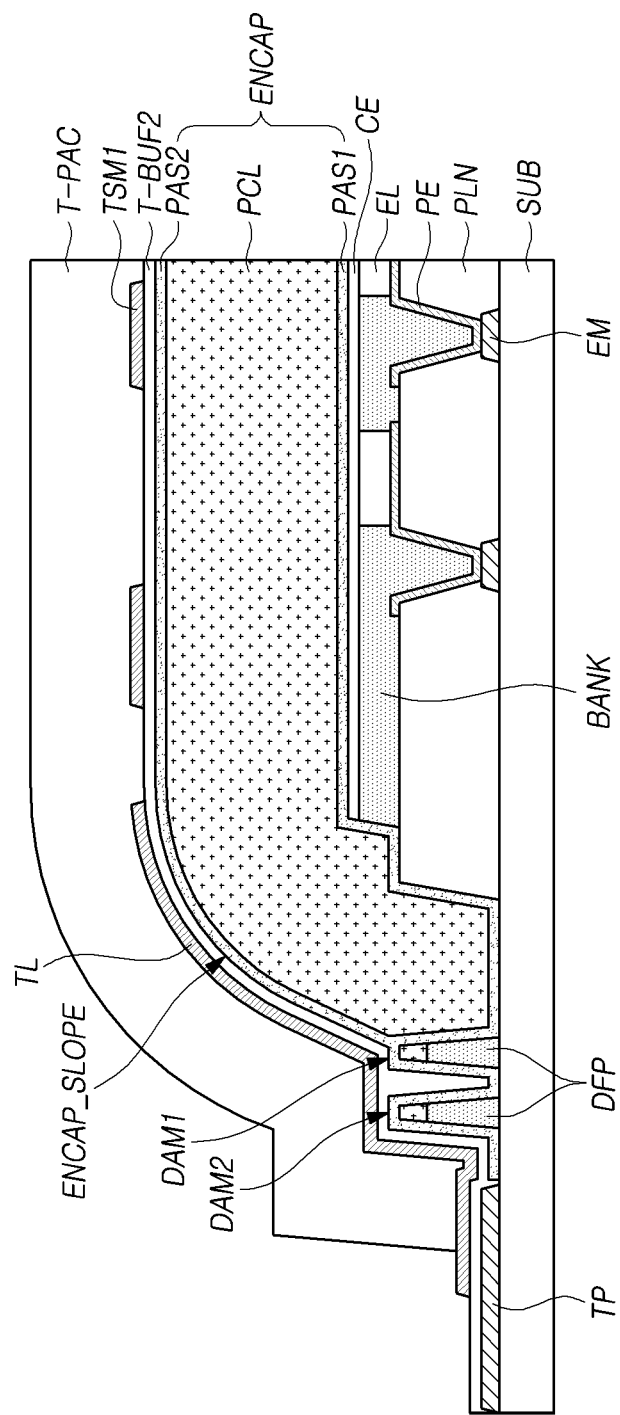

FIGS. 3A, 3B, and 3C are cross-sectional views of the touch display device 100 according to the embodiments of the present disclosure.

Referring to FIGS. 3A, 3B, and 3C, a transistor array and various signal lines are disposed on a substrate SUB. The transistors DRT and SCT and the capacitor CST included in each of the sub-pixels SP, and signal lines such as the plurality of data lines DL, the plurality of gate lines GL, and the like are disposed on the substrate SUB.

Referring to FIGS. 3A, 3B, and 3C, a plurality of electrodes EM corresponding to the second nodes N2 of the plurality of driving transistors DRT are disposed on the substrate SUB.

As described above, the light-emitting element ED includes the pixel electrode PE, the light-emitting layer EL, and the common electrode CE.

Referring to FIGS. 3A, 3B, and 3C, the pixel electrode PE is electrically connected to the electrode EM exposed through a contact hole of a planarization film PLN and corresponding to the second node N2 of the driving transistor DRT.

Referring to FIGS. 3A, 3B, and 3C, a bank BANK is open such that a portion of the pixel electrode PE of each of the sub-pixels SP is exposed. The exposed portion of the pixel electrode PE corresponds to a light-emitting area of the sub-pixel SP.

The light-emitting layer EL is formed on the portion of the pixel electrode PE exposed by the bank BANK. The light-emitting layer EL may be formed by laminating a hole-related layer, a light-emitting layer, and an electron-related layer on the pixel electrode PE in this order or in reverse order. The common electrode CE may be formed to face the pixel electrode PE with the light-emitting layer EL therebetween.

An encapsulation layer ENCAP may block external moisture or oxygen from penetrating into the light-emitting element ED that is vulnerable to the external moisture or oxygen. The encapsulation layer ENCAP may be formed of a single layer, but the encapsulation layer ENCAP may also be formed of a plurality of layers (PAS1, PCL, and PAS2).

For example, in the case that the encapsulation layer ENCAP is formed of the plurality of layers (PAS1, PCL, and PAS2), the encapsulation layer ENCAP may include one or more inorganic encapsulation layers (PAS1 and PAS2) and one or more organic encapsulation layers (PCL).

As a specific example, the encapsulation layer ENCAP may have a structure in which a first inorganic encapsulation layer PAS1, an organic encapsulation layer PCL, and a second inorganic encapsulation layer PAS2 are sequentially laminated, as illustrated in FIGS. 3A, 3B, and 3C. Here, the organic encapsulation layer PCL may further include at least one organic encapsulation layer or at least one inorganic encapsulation layer.

The first inorganic encapsulation layer PAS1 may be formed above the substrate SUB, above which the common electrode CE is formed, so as to be closest to the light-emitting element ED. The first inorganic encapsulation layer PAS1 may be made of an inorganic insulating material capable of being deposited at a low temperature such as silicon nitride ($SiN_x$), silicon oxide ($SiO_x$), silicon oxynitride (SiON), aluminum oxide ($Al_2O_3$), or the like. Since the first inorganic encapsulation layer PAS1 is deposited in a low-temperature atmosphere, the first inorganic encapsulation layer PAS1 may prevent the light-emitting layer EL containing an organic material vulnerable to a high-temperature atmosphere from being damaged during the deposition process.

The organic encapsulation layer PCL may be formed to have an area less than that of the first inorganic encapsulation layer PAS1, and in this case, the organic encapsulation layer PCL may be formed to expose both ends of the first inorganic encapsulation layer PAS1. The organic encapsulation layer PCL may serve as a buffer to mitigate the stress between the layers, caused by bending of the touch display device that is an organic light-emitting display device and may serve to enhance planarization performance. The organic encapsulation layer PCL may be, for example, made of an organic insulating material such as an acrylic resin, an epoxy resin, polyimide, polyethylene, or silicon oxycarbon (SiOC). As an example, the organic encapsulation layer PCL may be formed through an inkjet method.

One or more dams DAM1 and DMA2 may be formed in the display panel 110 to prevent the encapsulation layer ENCAP from collapsing.

The one or more dams DAM1 and DMA2 may be present at a boundary area between the active area AA and the non-active area NA, or near the boundary area. For example, the one or more dams DAM1 and DMA2 may be an area of a point that goes inward from the outer periphery and then suddenly rises. Alternatively, the one or more dams DAM1 and DMA2 may refer to an area of a point that is lowered along an inclined surface ENCAP_SLOPE of the encapsulation layer ENCAP and changed in a direction in which the slope of the encapsulation layer ENCAP suddenly becomes gentle or increases again.

As shown in FIGS. 3A, 3B, and 3C, the one or more dams DAM1 and DMA2 may be disposed between the active area AA and the driving pad area 121.

The one or more dams DAM1 and DMA2 may be located only in the non-active area NA or may be present mostly in the non-active area NA, but some of the one or more dams DAM1 and DMA2 may be present over the active area AA.

The one or more dams DAM1 and DMA2 may prevent the organic encapsulation layer PCL in a liquid state from collapsing in a direction of the non-active area NA to invade a touch pad TP in the driving pad area 121 or the like when the organic encapsulation layer PCL in a liquid state is dropped in the active area AA. Such an effect may be further enhanced in the case that two or more dams DAM1 and DAM2 are formed.

One or more of a first dam DAM1, which is closest to the active area AA, and a second dam DAM2, which is next closest to the active area AA, may be formed in a single layer or multi-layer structure. The first dam DAM1 and/or the second dam DAM2 may be basically formed of a dam forming pattern DFP. The dam forming pattern DFP may have a height greater than that of the touch pad TP disposed in the driving pad area 121.

The dam forming pattern DFP may be made of the same material or substantially the same material as the bank BANK configured to separate the sub-pixels SP in the active area AA. In some cases, the dam forming pattern DFP may be made of the same material or substantially the same material as a spacer configured to maintain interlayer spacing. In this case, the dam forming pattern DFP may be formed at the same time or substantially the same time as the bank BANK or the spacer, and accordingly, the dam structure may be formed without an additional masking process and increasing costs.

The first dam DAM1 and/or the second dam DAM2 may be formed in a multi-layer structure in which one or more of the first inorganic encapsulation layer PAS1, the second inorganic encapsulation layer PAS2, the organic encapsulation layer PCL are laminated on the dam forming pattern DFP.

The organic encapsulation layer PCL containing an organic material may be located only on an inner surface of the first dam DAM1 at an innermost side. Alternatively, the organic encapsulation layer PCL containing an organic material may be located at an upper portion of at least the first dam DAM1 among the first dam DAM1 and the second dam DAM2.

The second inorganic encapsulation layer PAS2 may be formed above the substrate SUB, above which the organic encapsulation layer PCL is formed, so as to cover or partially cover an upper surface and side surfaces of each of the organic encapsulation layer PCL and the first inorganic encapsulation layer PAS1. The second inorganic encapsulation layer PAS2 may minimize or block external moisture or oxygen from penetrating into the first inorganic encapsulation layer PAS1 and the organic encapsulation layer PCL. The second inorganic encapsulation layer PAS2 may be made of an inorganic insulating material such as silicon nitride ($SiN_x$), silicon oxide ($SiO_x$), silicon oxynitride (SiON), aluminum oxide ($Al_2O_3$), or the like.

Referring to FIGS. 3A, 3B, and 3C, a touch sensor structure such as the touch electrode TE and the touch routing line TL is disposed on the encapsulation layer ENCAP. The touch sensor structure may include the plurality of touch electrodes TE, the plurality of touch routing lines TL, and the like.

FIGS. 3A and 3B illustrate a multi-layered touch sensor structure, and according to the multi-layered touch sensor structure, the plurality of touch electrodes TE are disposed in a different layer from the plurality of touch routing lines TL.

Referring to FIGS. 3A and 3B, the multi-layered touch sensor structure may include a first touch sensor metal layer TSM1 in which a first touch sensor metal is disposed, a second touch sensor metal layer TSM2 in which a second touch sensor metal is disposed, and a first touch buffer layer T-BUF1 disposed between the first touch sensor metal layer TSM1 and the second touch sensor metal layer TSM2.

Referring to FIGS. 3A and 3B, the touch electrode TE may be located in the first touch sensor metal layer TSM1. The touch routing line TL may be located in one or more of the first touch sensor metal layer TSM1 and the second touch sensor metal layer TSM2.

As shown in FIGS. 3A and 3B, a touch buffer layer may not be present between the encapsulation layer ENCAP and the second touch sensor metal layer TSM2. Alternatively, a touch buffer layer may be additionally present between the encapsulation layer ENCAP and the second touch sensor metal layer TSM2.

In the case that there is an additional touch buffer layer located between the encapsulation layer ENCAP and the second touch sensor metal layer TSM2, the additional touch buffer layer may be designed such that the separation distance between the touch electrode TE and the common electrode CE of the light-emitting element ED maintains a predetermined minimum separation distance (e.g., 5 μm). Accordingly, it is possible to reduce or prevent parasitic capacitance formed between the touch electrode TE and the common electrode CE, thereby preventing a decrease in touch sensitivity caused by the parasitic capacitance.

The additional touch buffer layer located between the encapsulation layer ENCAP and the second touch sensor metal layer TSM2 may prevent a chemical solution (developer, etchant, or the like) used in the manufacturing process of the first or second touch sensor metal layer TSM1 or TSM2 disposed on the additional touch buffer layer or external moisture or the like from penetrating into the light-emitting layer EL containing an organic material. Accordingly, the additional touch buffer layer may prevent the light-emitting layer EL, vulnerable to the chemical solution or moisture, from being damaged.

The additional touch buffer layer located between the encapsulation layer ENCAP and the second touch sensor metal layer TSM2 may be formed at a low temperature below a predetermined temperature (for example, 100° C.) to prevent the light-emitting layer EL containing an organic material vulnerable to high temperature from being damaged, and may be made of an organic insulating material having a low dielectric constant of 1 to 3. For example, the additional touch buffer layer may be made of an acrylic-based material, an epoxy-based material, or a siloxane-based material. The additional touch buffer layer having planarization performance as an organic insulating material may prevent each encapsulation layer PAS1, PCL, or PAS2 in the encapsulation layer ENCAP from being damaged and the first or second touch sensor metal layer TSM1 or TSM2 formed on the additional touch buffer layer from being broken caused by bending of the organic light-emitting display device.

FIG. 3C illustrates a single-layered touch sensor structure, and according to the single-layered touch sensor structure, the plurality of touch electrodes TE and the plurality of touch routing lines TL are disposed in the same layer.

Referring to FIG. 3C, the single-layered touch sensor structure may include a second touch buffer layer T-BUF2 located on the encapsulation layer ENCAP, and a first touch sensor metal layer TSM1 located on the second touch buffer layer T-BUF2 and having a first touch sensor metal disposed therein.

Referring to FIG. 3C, the touch electrode TE and the touch routing line TL may be located in the first touch sensor metal layer TSM1.

Referring to FIG. 3C, although a touch buffer layer is not present on the first touch sensor metal layer TSM1, a touch buffer layer may be additionally disposed on the first touch sensor metal layer TSM1.

Referring to FIG. 3C, the second touch buffer layer T-BUF2 is present between the encapsulation layer ENCAP and the first touch sensor metal layer TSM1. However, the second touch buffer layer T-BUF2 may not be present between the encapsulation layer ENCAP and the first touch sensor metal layer TSM1.

Referring to FIG. 3C, the second touch buffer layer T-BUF2 located between the encapsulation layer ENCAP and the first touch sensor metal layer TSM1 may be designed such that the separation distance between the touch electrode TE and the common electrode CE of the light-emitting element ED maintains a predetermined minimum separation distance (e.g., 5 μm). Accordingly, it is possible to reduce or prevent parasitic capacitance formed between the touch electrode TE and the common electrode CE, thereby preventing a decrease in touch sensitivity caused by the parasitic capacitance.

The second touch buffer layer T-BUF2 located between the encapsulation layer ENCAP and the first touch sensor metal layer TSM1 may prevent a chemical solution (developer, etchant, or the like) used in the manufacturing process of the first touch sensor metal layer TSM1 disposed on the second touch buffer layer T-BUF2 or external moisture or the like from penetrating into the light-emitting layer EL containing an organic material. Accordingly, the second touch buffer layer T-BUF2 may prevent the light-emitting layer EL, vulnerable to the chemical solution or moisture, from being damaged.

The second touch buffer layer T-BUF2, located between the encapsulation layer ENCAP and the first touch sensor metal layer TSM1, may be formed at a low temperature below a predetermined temperature (for example, 100° C.) to prevent the light-emitting layer EL containing an organic material vulnerable to high temperature from being damaged, and may be made of an organic insulating material having a low dielectric constant of 1 to 3. For example, the second touch buffer layer T-BUF2 may be made of an acrylic-based material, an epoxy-based material, or a siloxane-based material. The touch buffer layer T-BUF having planarization performance as an organic insulating material may prevent each encapsulation layer PAS1, PCL, or PAS2 in the encapsulation layer ENCAP from being damaged and the first touch sensor metal layer TSM1 formed on the second touch buffer layer T-BUF2 from being broken caused by bending of the organic light-emitting display device.

Referring to FIGS. 3A, 3B, and 3C, a passivation layer T-PAC may be disposed on the first touch sensor metal layer TSM1.

Referring to FIGS. 3A, 3B, and 3C, the touch routing line TL may descend along an inclined surface ENCAP_SLOPE of the encapsulation layer ENCAP and may be electrically connected to the touch pad TP disposed in the driving pad area 121 in the non-active area NA. The touch pad TP may be electrically connected to the touch driving circuit 210.

The touch pad TP may be formed separately from the touch routing line TL or may be formed by extending the touch routing line TL.

When the touch pad TP is formed by extending the touch routing line TL, the touch pad TP and the touch routing line TL may be made of the same conductive material. As an example, the conductive material may have a single-layer structure or a multi-layer structure using a metal having high corrosion resistance and acid resistance, and good conductivity, such as Al, Ti, Cu, and Mo.

For example, the touch pad TP and the touch routing line TL may be formed in a laminated three-layer structure such as Ti/Al/Ti or Mo/Al/Mo.

A pad cover electrode capable of covering or partially covering the touch pad TP may be made of a conductive material (first touch sensor metal) that is the same material or substantially the same material as the touch electrode TE. The conductive material may be a transparent conductive material such as indium tin oxide (ITO) or indium zinc oxide (IZO) having high corrosion resistance and acid resistance. The pad cover electrode may be bonded to the touch driving circuit 210 or may be bonded to a circuit film on which the touch driving circuit 210 is mounted by being formed to be exposed by the touch buffer layer.

Here, the touch buffer layer is formed to cover or partially cover the touch sensor metal, thereby preventing the touch sensor metal from being corroded by external moisture or the like. As an example, the touch buffer layer may be made of an organic insulating material, or may be formed as a circular polarizer or a film of epoxy or acrylic material. The touch buffer layer may not be present on the encapsulation layer ENCAP. That is, the touch buffer layer may not be an essential element.

The touch routing line TL may be electrically connected to the touch electrode TE through a contact hole or may be integrated with the touch electrode TE.

Meanwhile, the cross-sectional views of FIGS. 3A, 3B, and 3C conceptually illustrate the structure, and thus, the position, thickness, or width of each pattern (various layers or electrodes) may vary according to the viewing direction or position. In addition, the connection structure of various patterns may also be changed, and there may be additional layers other than the illustrated several layers, and some of the illustrated layers may be omitted or integrated. For example, the width of the bank BANK may be narrower than the case in the drawing, and the height of the dams DAM1 and DAM2 may be lower or higher than the case in the drawing.

Figure 4:
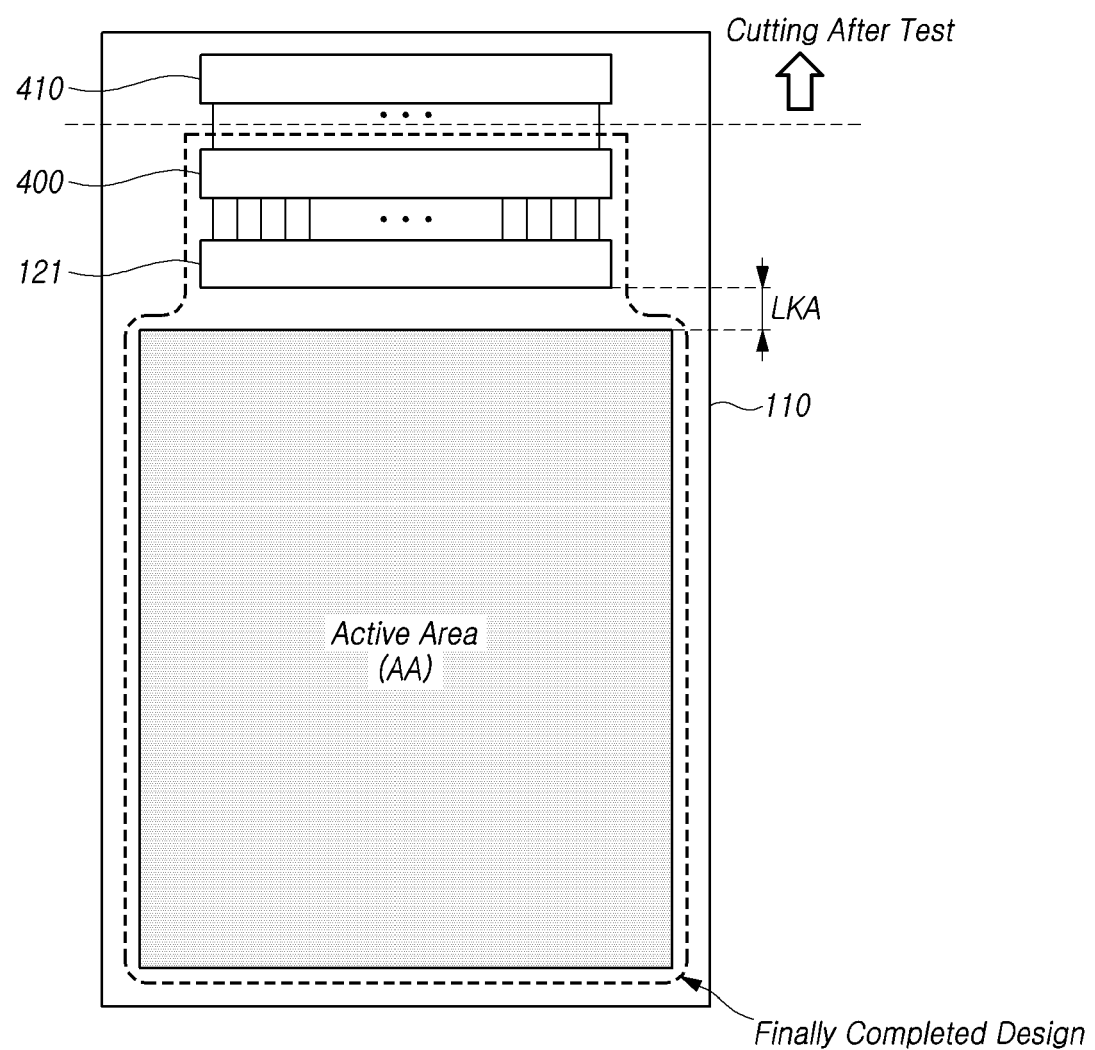
FIG. 4 is a plan view of the touch display device according to embodiments of the present disclosure.

FIG. 4 is a plan view of the touch display device 100 according to the embodiments of the present disclosure.

Referring to FIG. 4, the display panel 110 may include the active area AA in which an image is displayed, and the non-active area NA, which is an outer area of the active area AA.

The non-active area NA in the display panel 110 may include the driving pad area 121 located at an upper outer periphery of the active area AA. The non-active area NA in the display panel 110 may include a link area LKA located between the active area AA and the driving pad area 121.

The non-active area NA in the display panel 110 may further include a circuit area located at left and/or right outer peripheries of the active area AA. In the circuit area, the gate driving circuit 130 of a GIP type may be disposed. Alternatively, in the circuit area, the plurality of touch routing lines TL may be disposed.

Various types of signal lines (e.g., data lines, data link lines, touch routing lines, and the like) may extend to the driving pad area 121 through the link area LKA.

Referring to FIG. 4, the non-active area NA of the display panel 110 may be subjected to a test process for testing whether the touch sensor structure including the plurality of touch electrodes TE and the plurality of touch routing lines TL is well formed in the manufacturing process of the display panel 110.

Referring to FIG. 4, the touch display device 100 according to the embodiments of the present disclosure may include a test circuit 400 and a test pad area 410 in order to test the touch sensor structure.

Referring to FIG. 4, the test circuit 400 and the test pad area 410 may be disposed further outward than the driving pad area 121.

Referring to FIG. 4, when the test using the test circuit 400 and the test pad area 410 is completed, a cutting process is performed to complete the production of the display panel 110 for the final product. In the cutting process, a cutting operation may be performed between the test circuit 400 and the test pad area 410. Alternatively, in the cutting process, the cutting operation may be performed between a first area and a second region in the test circuit 400.

Referring to FIG. 4, an area in which the display panel 110 is bent may be present between the link area LKA and the driving pad area 121.

Figure 5:
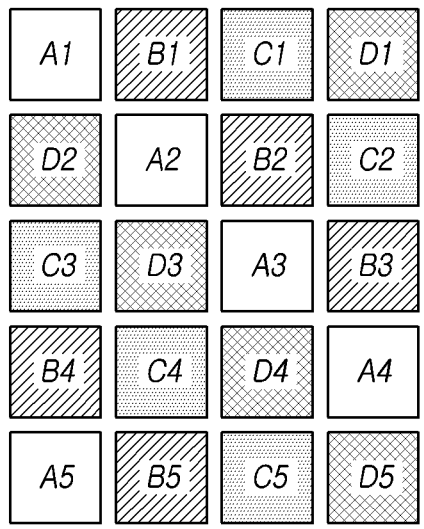
FIG. 5 is a view for describing the test grouping of touch electrodes of the touch display device according to embodiments of the present disclosure.

FIG. 5 is a view for describing the test grouping of the touch electrodes TE of the touch display device 100 according to the embodiments of the present disclosure.

Referring to FIG. 5, in the touch display device 100 according to the embodiments of the present disclosure, a plurality of touch electrodes TE (A1 to A5, B1 to B5, C1 to C5, and D1 to D5) are not individually tested, and the plurality of touch electrodes TE (A1 to A5, B1 to B5, C1 to C5, and D1 to D5) are grouped into several test groups GR_A, GR_B, GR_C, and GR_D to perform testing.

For example, 20 touch electrodes TE (A1 to A5, B1 to B5, C1 to C5, and D1 to D5) may be grouped into four test groups GR_A, GR_B, GR_C, and GR_D.

Five touch electrodes A1 to A5 included in a first test group GR_A may be electrically shorted and thus simultaneously subjected to testing. The five touch electrodes A1 to A5 included in the first test group GR_A may be disposed to be adjacent to each other, but may be disposed by being dispersed as shown in FIG. 5.

Five touch electrodes B1 to B5 included in a second test group GR_B may be electrically shorted and thus simultaneously subjected to testing. The five touch electrodes B1 to B5 included in the second test group GR_B may be disposed to be adjacent to each other, but may be disposed by being dispersed as shown in FIG. 5.

Five touch electrodes C1 to C5 included in a third test group GR_C may be electrically shorted and thus simultaneously subjected to testing. The five touch electrodes C1 to C5 included in the third test group GR_C may be disposed to be adjacent to each other, but may be disposed by being dispersed as shown in FIG. 5.

Five touch electrodes D1 to D5 included in a fourth test group GR_D may be electrically shorted and thus simultaneously subjected to testing. The five touch electrodes D1 to D5 included in the fourth test group GR_D may be disposed to be adjacent to each other, but may be disposed by being dispersed as shown in FIG. 5.

By using such a group test method, the number of test pads may be greatly reduced. According to the group test method shown in FIG. 5, the number of test pads may be reduced from 20 to 4. The greater the number of touch electrodes, the greater the effect of reducing the number of test pads.

Figure 6:
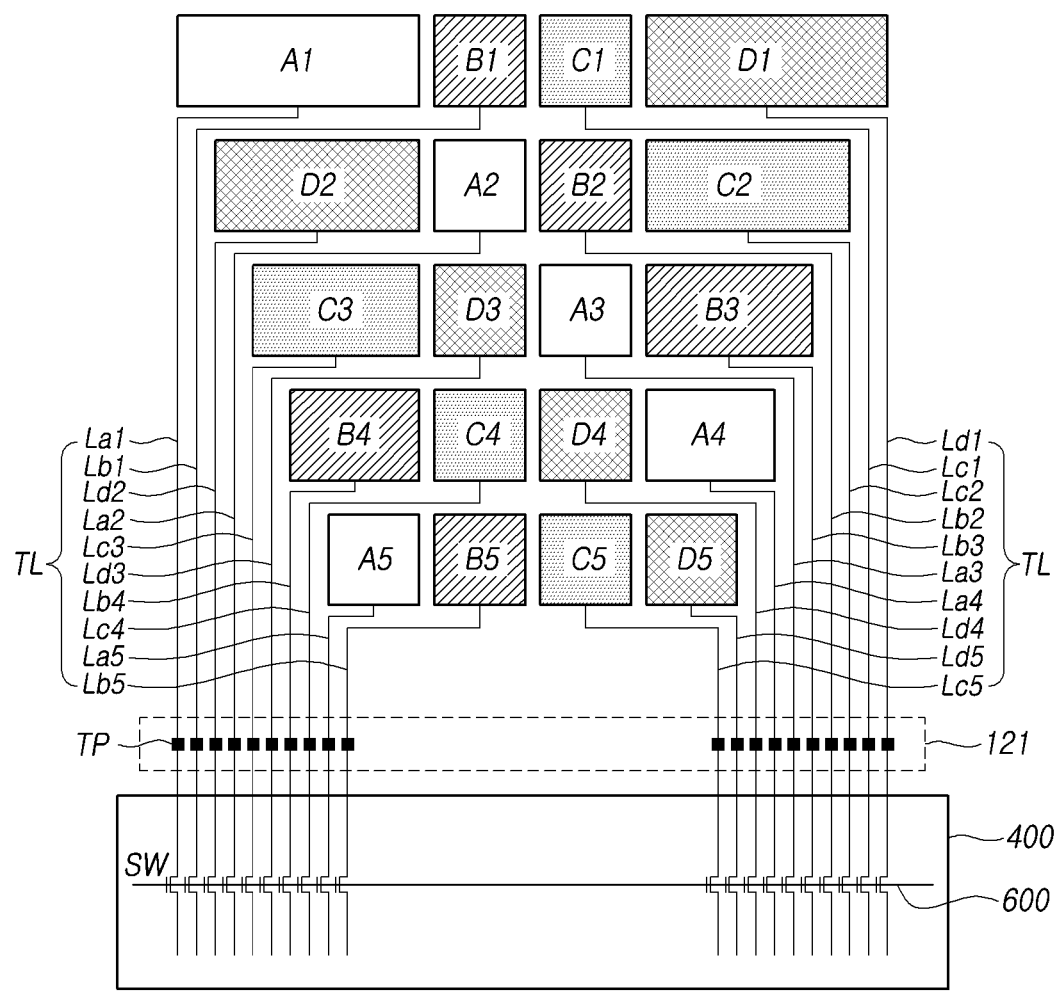
FIG. 6 is a diagram illustrating a test system of the touch electrodes under a single-layered touch sensor structure of the touch display device according to embodiments of the present disclosure.

FIG. 6 is a diagram illustrating a test system of the touch electrodes TE under the single-layered touch sensor structure of the touch display device 100 according to the embodiments of the present disclosure. However, FIG. 6 is a diagram illustrating a state in which the test is completed and the cutting process is completed thereafter.

Referring to FIG. 6, when the touch display device 100 according to the embodiments of the present disclosure has the single-layered touch sensor structure (see FIG. 3C), 20 touch routing lines TL (La1 to La5, Lb1 to Lb5, Lc1 to Lc5, and Ld1 to Ld5) and the 20 touch electrodes TE (A1 to A5, B1 to B5, C1 to C5, and D1 to D5) may be disposed in the same layer (the first touch sensor metal layer TSM1).

In this case, the 20 touch routing lines TL (La1 to La5, Lb1 to Lb5, Lc1 to Lc5, and Ld1 to Ld5) must pass through the spaces between the 20 touch electrodes TE (A1 to A5, B1 to B5, C1 to C5, and D1 to D5) in order to be disposed in the same first touch sensor metal layer TSM1 as the 20 touch electrodes TE (A1 to A5, B1 to B5, C1 to C5, and D1 to D5).

Referring to FIG. 6, in order to secure the arrangement space of the 20 touch routing lines TL (La1 to La5, Lb1 to Lb5, Lc1 to Lc5, and Ld1 to Ld5) and expand a touch electrode size to increase touch sensitivity, as shown in FIG. 6, the areas occupied by the 20 touch electrodes TE (A1 to A5, B1 to B5, C1 to C5, and D1 to D5) may be different from each other.

Referring to FIG. 6, the area occupied by each of the 20 touch electrodes TE (A1 to A5, B1 to B5, C1 to C5, and D1 to D5) may be reduced as it is closer to the driving pad area 121.

The area occupied by each of the 20 touch electrodes TE (A1 to A5, B1 to B5, C1 to C5, and D1 to D5) may be reduced as the corresponding touch routing line is shortened.

When the touch display device 100 according to the embodiments of the present disclosure has the single-layered touch sensor structure (see FIG. 3C), the 20 touch routing lines TL (La1 to La5, Lb1 to Lb5, Lc1 to Lc5, and Ld1 to Ld5) may be disposed in the first touch sensor metal layer TSM1 together with the 20 touch electrodes TE (A1 to A5, B1 to B5, C1 to C5, and D1 to D5).

In this case, the touch display device 100 according to the embodiments of the present disclosure may further include the second touch buffer layer T-BUF2 located between the encapsulation layer ENCAP and the first touch sensor metal layer TSM1, as shown in FIG. 3C. The second touch buffer layer T-BUF2 may not be present.

Referring to FIG. 6, the 20 touch routing lines TL (La1 to La5, Lb1 to Lb5, Lc1 to Lc5, and Ld1 to Ld5) are electrically connected to 20 touch pads TP in the driving pad area 121.

Each of the 20 touch pads TP is electrically connected to the test circuit 400.

The test circuit 400 may include 20 outer switches SW.

One ends of the 20 outer switches SW are electrically connected to the 20 touch pads TP in a corresponding manner.

The other ends of the 20 outer switches SW may be in a floating state. Here, the floating state may also be referred to as an open state, and is a state in which the other ends of the 20 outer switches SW are cut during the cutting process.

After the test is completed, the 20 outer switches SW are in a turned off state.

Each of the 20 outer switches SW may be implemented in the form of a transistor.

The one end of each of the 20 outer switches SW may be a drain node or a source node of the transistor, and the other end of each of the 20 outer switches SW may be a source node or a drain node of the transistor. An on-off control terminal of each of the 20 outer switches SW may be a gate node of the transistor.

The on-off control terminals of the 20 outer switches SW may be commonly connected to one or more control lines 600.

The on-off control terminals of the 20 outer switches SW may be commonly connected to one control line 600. Alternatively, the on-off control terminals of the 20 outer switches SW may be commonly connected to the control line 600 for each test group.

Figure 7:
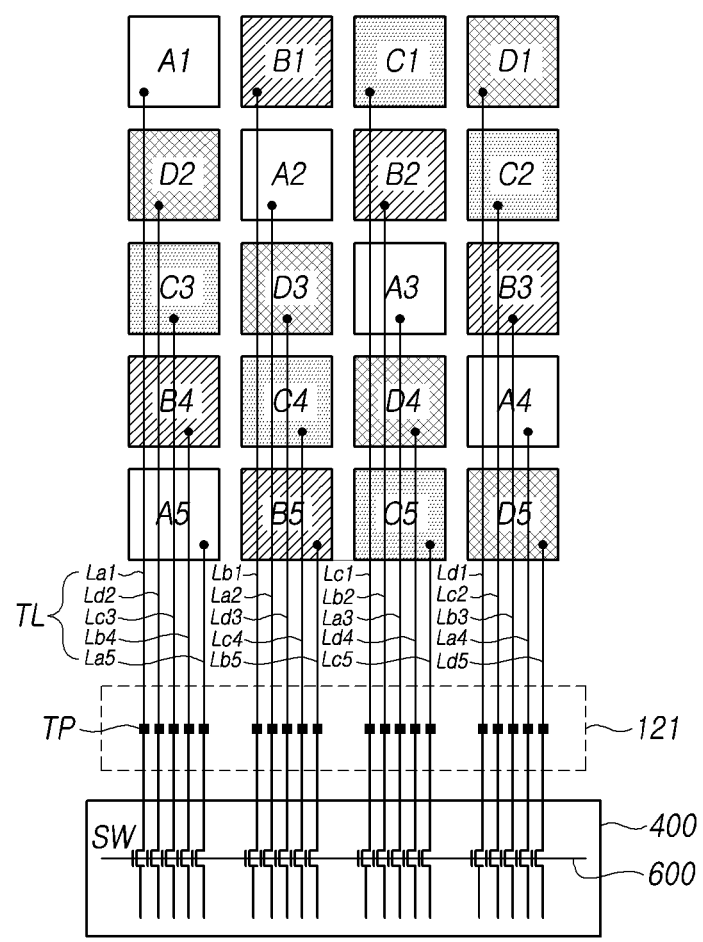
FIG. 7 is a diagram illustrating a test system of the touch electrodes under a multi-layered touch sensor structure of the touch display device according to embodiments of the present disclosure.

FIG. 7 is a diagram illustrating a test system of the touch electrodes TE under the multi-layered touch sensor structure of the touch display device 100 according to the embodiments of the present disclosure. However, FIG. 7 is a diagram illustrating a state in which the test is completed and the cutting process is completed thereafter.

Referring to FIG. 7, when the touch display device 100 according to the embodiments of the present disclosure has the multi-layered touch sensor structure (see FIGS. 3A and 3B), the 20 touch routing lines TL (La1 to La5, Lb1 to Lb5, Lc1 to Lc5, and Ld1 to Ld5) may be disposed in a different layer from the 20 touch electrodes TE (A1 to A5, B1 to B5, C1 to C5, and D1 to D5).

The 20 touch electrodes TE (A1 to A5, B1 to B5, C1 to C5, and D1 to D5) may be disposed in the first touch sensor metal layer TSM1.

The 20 touch routing lines TL (La1 to La5, Lb1 to Lb5, Lc1 to Lc5, and Ld1 to Ld5) may be disposed in the second touch sensor metal layer TSM2.

In some cases, a portion of each of the 20 touch routing lines TL (La1 to La5, Lb1 to Lb5, Lc1 to Lc5, and Ld1 to Ld5) may be disposed in the second touch sensor metal layer TSM2, and the other portion thereof may be disposed in the first touch sensor metal layer TSM1.

The 20 touch routing lines TL (La1 to La5, Lb1 to Lb5, Lc1 to Lc5, and Ld1 to Ld5) and the 20 touch electrodes TE (A1 to A5, B1 to B5, C1 to C5, and D1 to D5) may be disposed to overlap each other.

Referring to FIG. 7, the areas occupied by the 20 touch electrodes TE (A1 to A5, B1 to B5, C1 to C5, and D1 to D5) may be equivalent to each other or may be the same.

When the touch display device 100 according to the embodiments of the present disclosure has the multi-layered touch sensor structure (see FIGS. 3A and 3B), the touch display device 100 according to the embodiments of the present disclosure may further include the second touch sensor metal layer TSM2 located on the encapsulation layer ENCAP, the first touch buffer layer T-BUF1 located on the second touch sensor metal layer TSM2, and the first touch sensor metal layer TSM1 located on the first touch buffer layer T-BUF1.

In this case, the 20 touch electrodes TE (A1 to A5, B1 to B5, C1 to C5, and D1 to D5) may be disposed in the first touch sensor metal layer TSM1. The 20 touch routing lines TL (La1 to La5, Lb1 to Lb5, Lc1 to Lc5, and Ld1 to Ld5) may be disposed in the second touch sensor metal layer TSM2.

The touch display device 100 according to the embodiments of the present disclosure may further include an additional touch buffer layer located between the encapsulation layer ENCAP and the second touch sensor metal layer TSM2.

Referring to FIG. 7, the 20 touch routing lines TL (La1 to La5, Lb1 to Lb5, Lc1 to Lc5, and Ld1 to Ld5) are electrically connected to 20 touch pads TP in the driving pad area 121.

Each of the 20 touch pads TP is electrically connected to the test circuit 400.

The test circuit 400 may include 20 outer switches SW.

One ends of the 20 outer switches SW are electrically connected to the 20 touch pads TP in a corresponding manner.

The other ends of the 20 outer switches SW may be in a floating state. Here, the floating state may also be referred to as an open state, and is a state in which the other ends of the 20 outer switches SW are cut during the cutting process.

After the test is completed, the 20 outer switches SW are in a turned off state.

Each of the 20 outer switches SW may be implemented in the form of a transistor.

The one end of each of the 20 outer switches SW may be a drain node or a source node of the transistor, and the other end of each of the 20 outer switches SW may be a source node or a drain node of the transistor. An on-off control terminal of each of the 20 outer switches SW may be a gate node of the transistor.

The on-off control terminals of the 20 outer switches SW may be commonly connected to one or more control lines 600.

The on-off control terminals of the 20 outer switches SW may be commonly connected to one control line 600. Alternatively, the on-off control terminals of the 20 outer switches SW may be commonly connected to the control line 600 for each test group.

Figure 8:
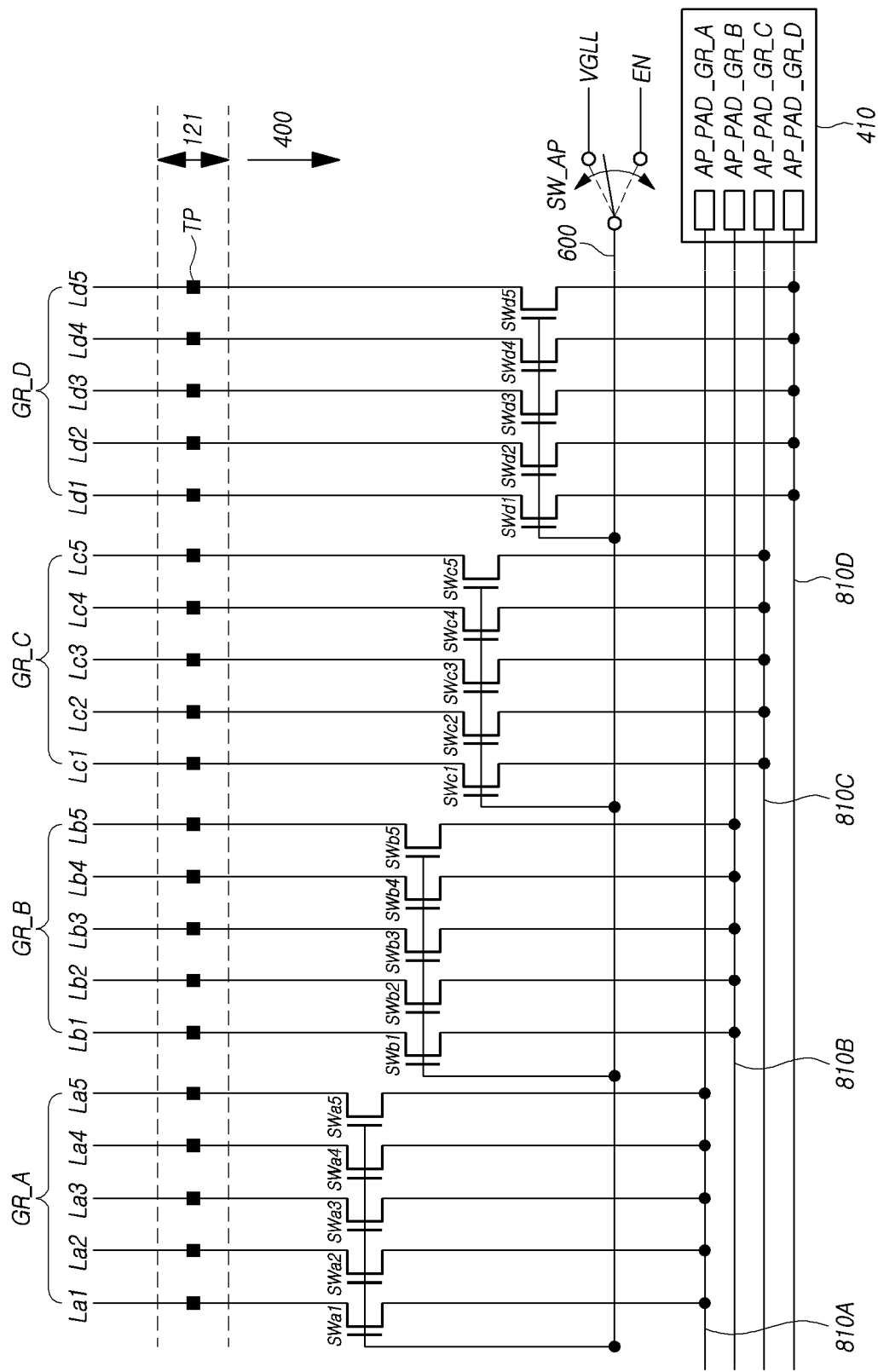
FIG. 8 is a view illustrating a test circuit of the touch display device according to embodiments of the present disclosure.
Figure 9:
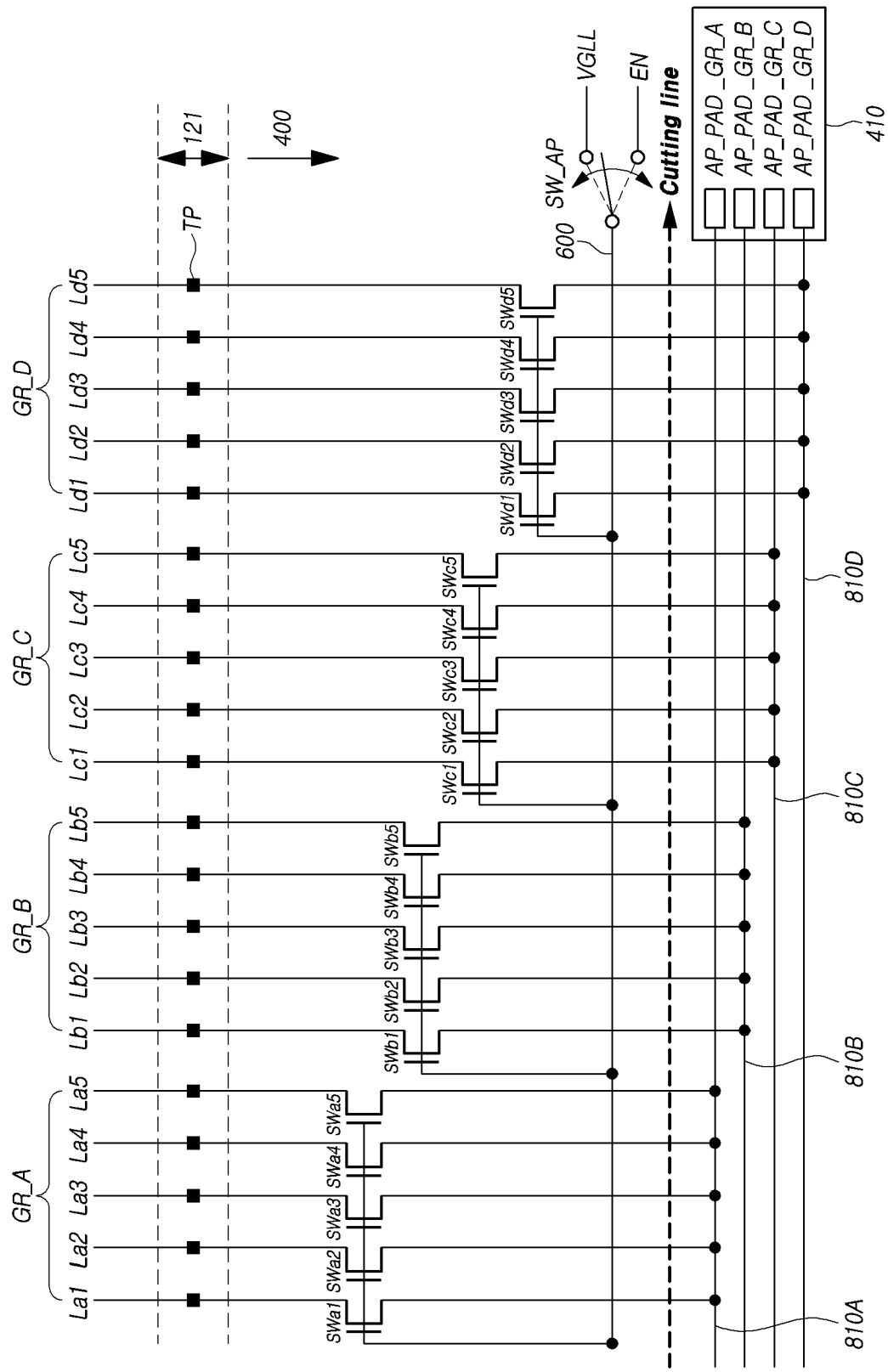
FIG. 9 is a view illustrating a line along which a portion of the test circuit is cut in a cutting process after the test is completed during the manufacturing process of the touch display device according to embodiments of the present disclosure.

FIG. 8 is a view illustrating a test circuit 400 in a state before testing the touch display device 100 according to the embodiments of the present disclosure. FIG. 9 is a view illustrating a line along which a portion of the test circuit 400 is cut after the test is completed during the manufacturing process of the touch display device 100 according to the embodiments of the present disclosure.

Referring to FIG. 8, when the touch display device 100 according to the embodiments of the present disclosure includes the test structure of FIG. 6 or 8, the touch display device 100 may include: a substrate SUB; a transistor DRT disposed on the substrate SUB; a pixel electrode PE connected to a source electrode or a drain electrode of the transistor DRT; a common electrode CE disposed above the pixel electrode PE; an encapsulation layer ENCAP disposed on the common electrode CE; 20 touch electrodes TE (A1 to A5, B1 to B5, C1 to C5, and D1 to D5) located on the encapsulation layer ENCAP and disposed in a first touch sensor metal layer TSM1; a plurality of touch pads TP disposed in a driving pad area 121 in a non-active area NA that is an area outside an active area AA in which an image is displayed; and 20 touch routing lines TL (La1 to La5, Lb1 to Lb5, Lc1 to Lc5, and Ld1 to Ld5) connecting the 20 touch electrodes TE (A1 to A5, B1 to B5, C1 to C5, and D1 to D5) to the plurality of touch pads TP and descending along an inclined surface of the encapsulation layer ENCAP to extend to the driving pad area 121 in a state of being connected to the 20 touch electrodes TE (A1 to A5, B1 to B5, C1 to C5, and D1 to D5) in the active area AA.

Referring to FIGS. 8 and 9, the touch display device 100 according to the embodiments of the present disclosure may further include a test circuit 400.

Referring to FIGS. 8 and 9, the test circuit 400 of the touch display device 100 according to the embodiments of the present disclosure may include a plurality of outer switches SW (SWa1 to SWa5, SWb1 to SWb5, SWc1 to SWc5, and SWd1 to SWd5), a plurality of test lines 810A, 810B, 810C, and 810D corresponding to a plurality of test groups GR_A, GR_B, GR_C, and GR_D, a plurality of test pads AP_PAD_GR_A, AP_PAD_GR_B, AP_PAD_GR_C, and AP_PAD_GR_D connected to the plurality of test lines 810A, 810B, 810C, and 810D, and the like.

The plurality of test pads AP_PAD_GR_A, AP_PAD_GR_B, AP_PAD_GR_C, and AP_PAD_GR_D may be disposed in a test pad area 410.

The test pad area 410 may be disposed further outward than the driving pad area 121.

The test pad area 410 may remain in the display panel 110 whose manufacturing process is completed or may not remain in the display panel 110 by being cut away along a cutting line illustrated in FIG. 9.

The number of the plurality of outer switches SW (SWa1 to SWa5, SWb1 to SWb5, SWc1 to SWc5, and SWd1 to SWd5) may be equal to the overall number of touch electrodes TE disposed in the display panel 110 (in the case of the single routing structure).

Alternatively, the number of the plurality of outer switches SW (SWa1 to SWa5, SWb1 to SWb5, SWc1 to SWc5, and SWd1 to SWd5) may be equal to twice the overall number of touch electrodes TE disposed in the display panel 110 (in the case of the dual routing structure). In this case, the number of the plurality of outer switches SW (SWa1 to SWa5, SWb1 to SWb5, SWc1 to SWc5, and SWd1 to SWd5) may be equal to the overall number of touch routing lines TL disposed in the display panel 110 (in the case of the dual routing structure).

In FIGS. 8 and 9, the case in which the number of the plurality of outer switches SW (SWa1 to SWa5, SWb1 to SWb5, SWc1 to SWc5, and SWd1 to SWd5) is equal to the overall number of touch electrodes TE disposed in the display panel 110 is taken as an example.

The number of the plurality of test lines 810A, 810B, 810C, and 810D and the number of the plurality of test pads AP_PAD_GR_A, AP_PAD_GR_B, AP_PAD_GR_C, and AP_PAD_GR_D are each equal to the number of the test groups.

Referring to FIGS. 8 and 9, each of 20 outer switches SW (SWa1 to SWa5, SWb1 to SWb5, SWc1 to SWc5, and SWd1 to SWd5) may not overlap the inclined surface of the encapsulation layer ENCAP, and may be disposed further outward than the driving pad area 121.

Referring to FIG. 9, after the test is completed, in the final product, the 20 outer switches SW (SWa1 to SWa5, SWb1 to SWb5, SWc1 to SWc5, and SWd1 to SWd5) may include one ends electrically connected to the plurality of touch pads TP in the driving pad area 121 and the other ends in an electrically floating state.

Referring to FIG. 9, the floating state of the other end of each of the 20 outer switches SW (SWa1 to SWa5, SWb1 to SWb5, SWc1 to SWc5, and SWd1 to SWd5) means that the other end of each of the 20 outer switches SW (SWa1 to SWa5, SWb1 to SWb5, SWc1 to SWc5, and SWd1 to SWd5) is in an electrically open state and indicates a cut state during the cutting process.

Referring to FIG. 8, each of the 20 outer switches SW (SWa1 to SWa5, SWb1 to SWb5, SWc1 to SWc5, and SWd1 to SWd5) may include an on-off control terminal electrically connected to a control line 600.

Referring to FIG. 8, the on-off control terminals of the 20 outer switches SW (SWa1 to SWa5, SWb1 to SWb5, SWc1 to SWc5, and SWd1 to SWd5) may all be connected to one control line 600.

Referring to FIG. 8, the test circuit 400 may further include a test switch SW_AP configured to connect one of a test node to which a turn-on level voltage is applied and a normal node to which a turn-off level voltage is applied to the control line 600.

For example, the test node to which the turn-on level voltage is applied may be a node to which an enable signal EN enabling a test operation is applied. The enable signal EN may have a turn-on level voltage that may turn on the 20 outer switches SW (SWa1 to SWa5, SWb1 to SWb5, SWc1 to SWc5, and SWd1 to SWd5).

The normal node to which the turn-off level voltage is applied may be a node to which a control voltage is applied such that the test operation may be disabled and a touch driving operation may proceed normally. The control voltage may have a turn-off level voltage that may turn off the 20 outer switches SW (SWa1 to SWa5, SWb1 to SWb5, SWc1 to SWc5, and SWd1 to SWd5).

When the 20 outer switches SW (SWa1 to SWa5, SWb1 to SWb5, SWc1 to SWc5, and SWd1 to SWd5) are n-type, the enable signal EN may have a high-level voltage as the turn-on level voltage, and the control voltage may have a low-level voltage as the turn-off level voltage.

When the 20 outer switches SW (SWa1 to SWa5, SWb1 to SWb5, SWc1 to SWc5, and SWd1 to SWd5) are p-type, the enable signal EN may have a low-level voltage as the turn-on level voltage, and the control voltage may have a high-level voltage as the turn-off level voltage.

FIGS. 8 and 9 illustrate the case in which the 20 outer switches SW (SWa1 to SWa5, SWb1 to SWb5, SWc1 to SWc5, and SWd1 to SWd5) are n-type.

When the test is in progress, the enable signal EN of a turn-on level voltage is applied to the control line 600 by the test switch SW_AP. Accordingly, the 20 outer switches SW (SWa1 to SWa5, SWb1 to SWb5, SWc1 to SWc5, and SWd1 to SWd5) may be turned on.

A test driving circuit (not shown) may simultaneously or sequentially output test signals to four test pads AP_PAD_GR_A, AP_PAD_GR_B, AP_PAD_GR_C, and AP_PAD_GR_D, and then check the electrical states of the four test pads AP_PAD_GR_A, AP_PAD_GR_B, AP_PAD_GR_C, and AP_PAD_GR_D to detect defects (e.g., short circuit, open, and the like) in the touch sensor structure.

For example, when a test start event is generated for two or more touch electrodes A1 to A5 included in a first test group GR_A, the test node, to which the enable signal EN with a turn-on level voltage is applied by the test switch SW_AP, is connected to the control line 600, and the turn-on level voltage may be applied to the on-off control terminal of each of the two or more outer switches.

The test driving circuit outputs a test signal having a first level voltage (e.g., high-level voltage) to only a first test pad AP_PAD_GR_A among the four test pads AP_PAD_GR_A, AP_PAD_GR_B, AP_PAD_GR_C, and AP_PAD_GR_D, and does not output the test signal or outputs a test signal having a second level voltage different from the first level voltage to the remaining test pads AP_PAD_GR_B, AP_PAD_GR_C, and AP_PAD_GR_D.

In the case that the touch sensor structure for the first test group GR_A is normal, the test driving circuit may detect the applied first level voltage through the first test pad AP_PAD_GR_A. Here, the case that the touch sensor structure for the first test group GR_A is normal may mean that the five touch electrodes A1 to A5 included in the first test group GR_A are electrically well separated from each other in the active area AA, all the five touch electrodes A1 to A5 included in the first test group GR_A are electrically well separated from touch electrodes included in the other test groups GR_B, GR_C, and GR_D in the active area AA, and the five touch electrodes A1 to A5 included in the first test group GR_A accurately correspond to five touch routing lines La1 to La5 and are electrically connected thereto.

When there is a defect in which at least one of the five touch electrodes A1 to A5 included in the first test group GR_A is shorted with at least one of the touch electrodes included in the other test groups GR_B, GR_C, and GR_D, the test driving circuit detects a voltage different from the first level voltage through the first test pad AP_PAD_GR_A.

When there is a defect in which at least one of the five touch electrodes A1 to A5 included in the first test group GR_A is disconnected from the corresponding touch routing line and has an open state, the test driving circuit detects a voltage different from the first level voltage through the first test pad AP_PAD_GR_A.

When a test end event is generated for all the test groups GA_A to GR_D, and the display driving and the touch driving are normally performed in the display panel 110, the normal node, to which the turn-off level voltage is applied by the test switch SW_AP, may be connected to the control line 600, and the control voltage of a turn-off level voltage may be applied to the on-off control terminal of each of the 20 outer switches SW (SWa1 to SWa5, SWb1 to SWb5, SWc1 to SWc5, and SWd1 to SWd5).

When the test is completed, and the display driving and the touch driving are normally performed in the display panel 110, the control voltage whose voltage level is not varied may be applied to the on-off control terminal of each of the plurality of outer switches SW.

For example, the control voltage may be a turn-off level gate voltage VGL for display driving as the turn-off level voltage.

In this case, when the display driving and the touch driving are normally performed after the product is shipped, the test switch SW_AP may be fixed in a state in which the control line 600 is electrically connected to a gate voltage line VGLL to which the turn-off level gate voltage VGL for the display driving is applied.

That is, when the display driving and the touch driving are normally performed after the product is shipped, one or more control lines 600 commonly connected to the on-off control terminals of the plurality of outer switches SW may be electrically connected to the gate voltage line VGLL to which the turn-off level gate voltage VGL for the display driving is applied.

Hereinafter, a touch sensor structure, which is a test target in the test structure and the test method using the same described above, will be described in more detail.

Figure 10:
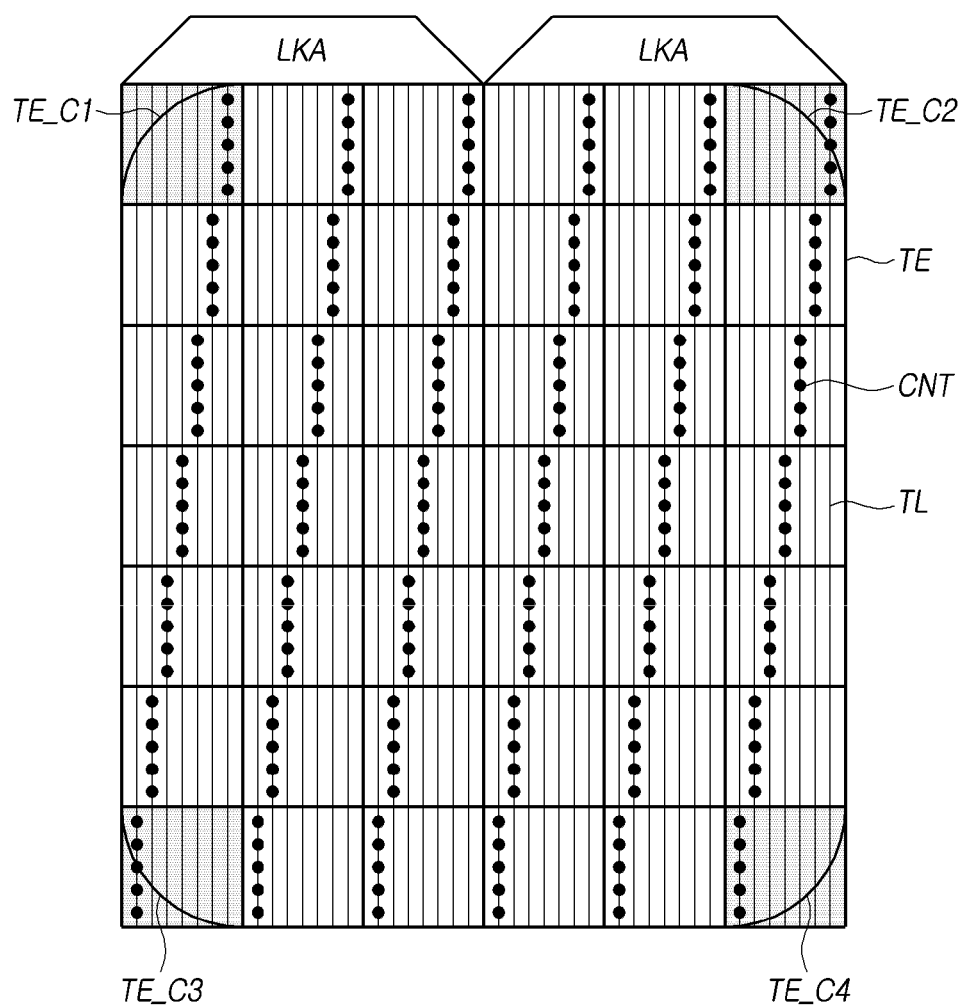
FIG. 10 is a view illustrating a first structure of touch routing lines of the touch display device according to embodiments of the present disclosure.
Figure 11:
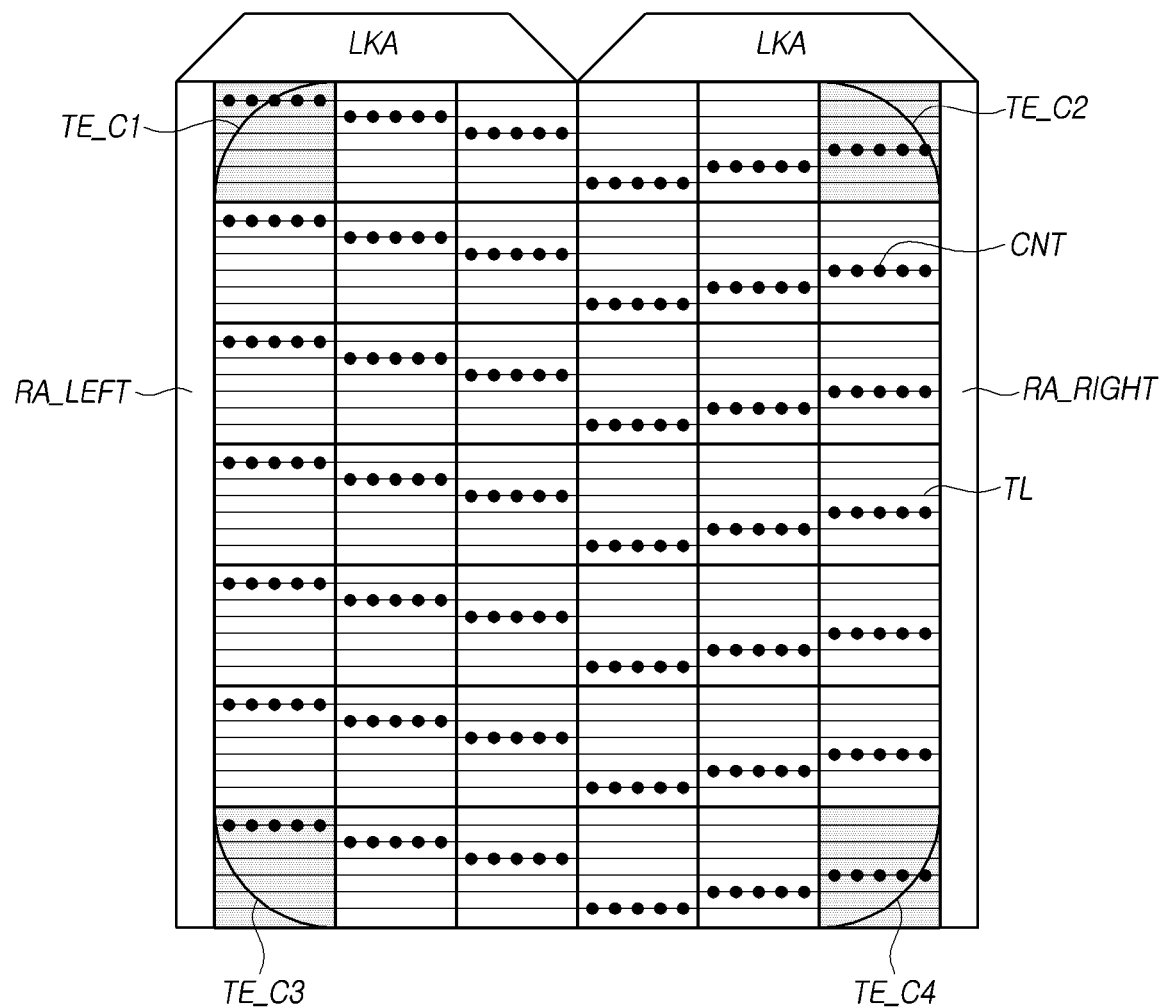
FIG. 11 is a view illustrating a second structure of the touch routing lines of the touch display device according to embodiments of the present disclosure.

FIGS. 10 and 11 are views illustrating first and second structures of the touch routing lines TL of the touch display device 100 according to the embodiments of the present disclosure.

Referring to FIGS. 10 and 11, when the touch display device 100 according to the embodiments of the present disclosure has the multi-layered touch sensor structure, the plurality of touch routing lines TL may be disposed in a different layer from the plurality of touch electrodes TE.

In this case, each of the plurality of touch routing lines TL may overlap at least one of the plurality of touch electrodes TE.

Referring to FIGS. 10 and 11, each of the plurality of touch routing lines TL may be disposed in a column direction or a row direction. As shown in FIG. 10, each of the plurality of touch routing lines TL may be disposed in the column direction. As shown in FIG. 11, each of the plurality of touch routing lines TL may be disposed in the row direction.

As shown in FIG. 11, when each of the plurality of touch routing lines TL is disposed in the row direction, the plurality of touch routing lines TL may bypass a left routing area RA_LEFT or a right routing area RA_RIGHT, located on a left outer periphery or a right outer periphery of the active area AA, in the non-active area NA and extend to the driving pad area 121 of the non-active area NA, which is located on an upper end of the link area LKA located on an upper outer periphery of the active area AA, through the link area LKA.

Four touch electrodes TE_C1, TE_C2, TE_C3, and TE_C4 located at four corners of the active area AA may have the same shape or substantially the same shape as touch electrodes located at areas other than the four corners, or may have a rounded corner shape as shown in FIGS. 10 and 11.

Referring to FIGS. 12 to 17, a third structure of the touch routing lines TL of the touch display device 100 according to the embodiments of the present disclosure will be described.

Figure 12:
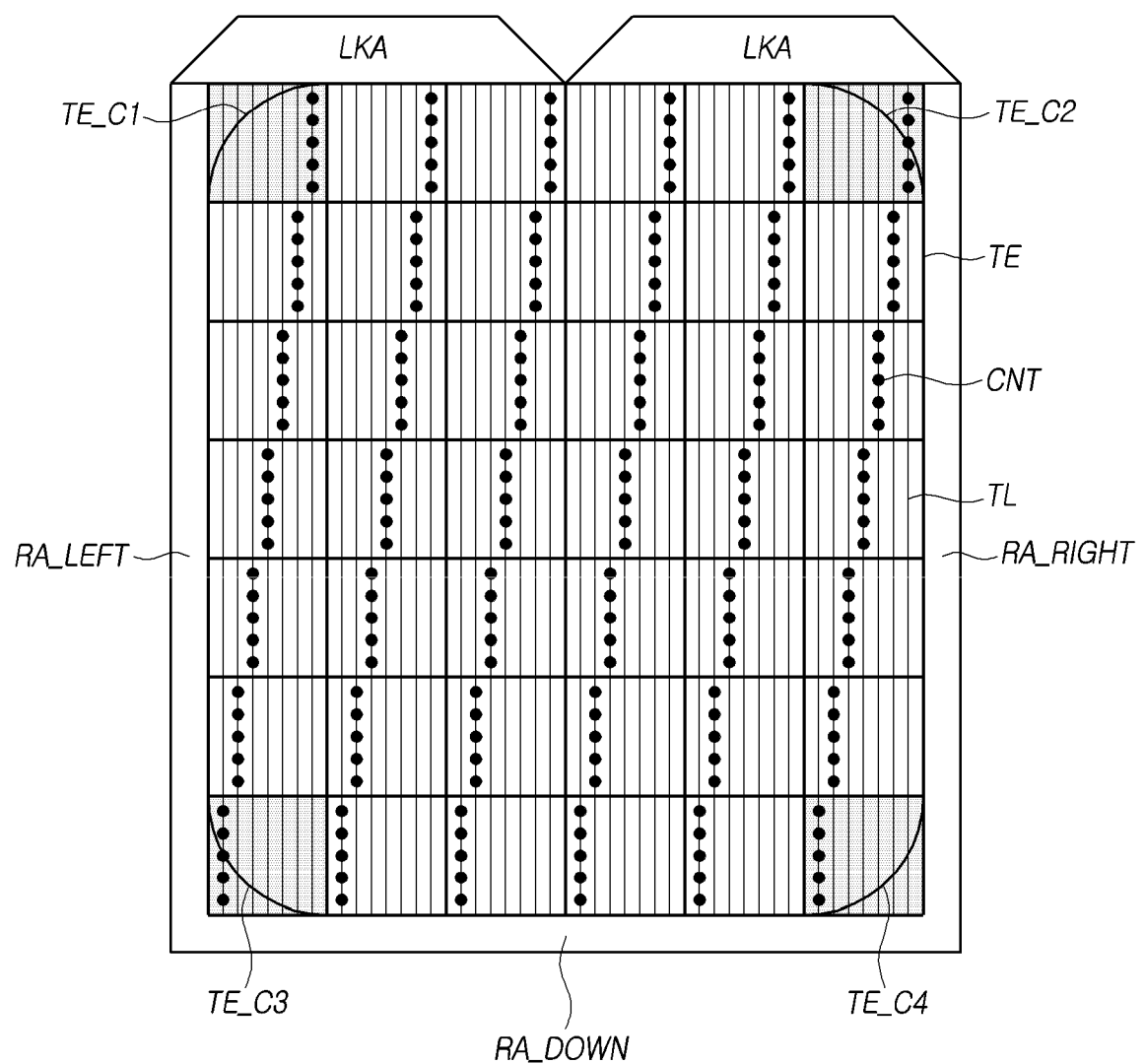
FIG. 12 is a view illustrating a third structure of the touch routing lines of the touch display device according to embodiments of the present disclosure.
Figure 13:
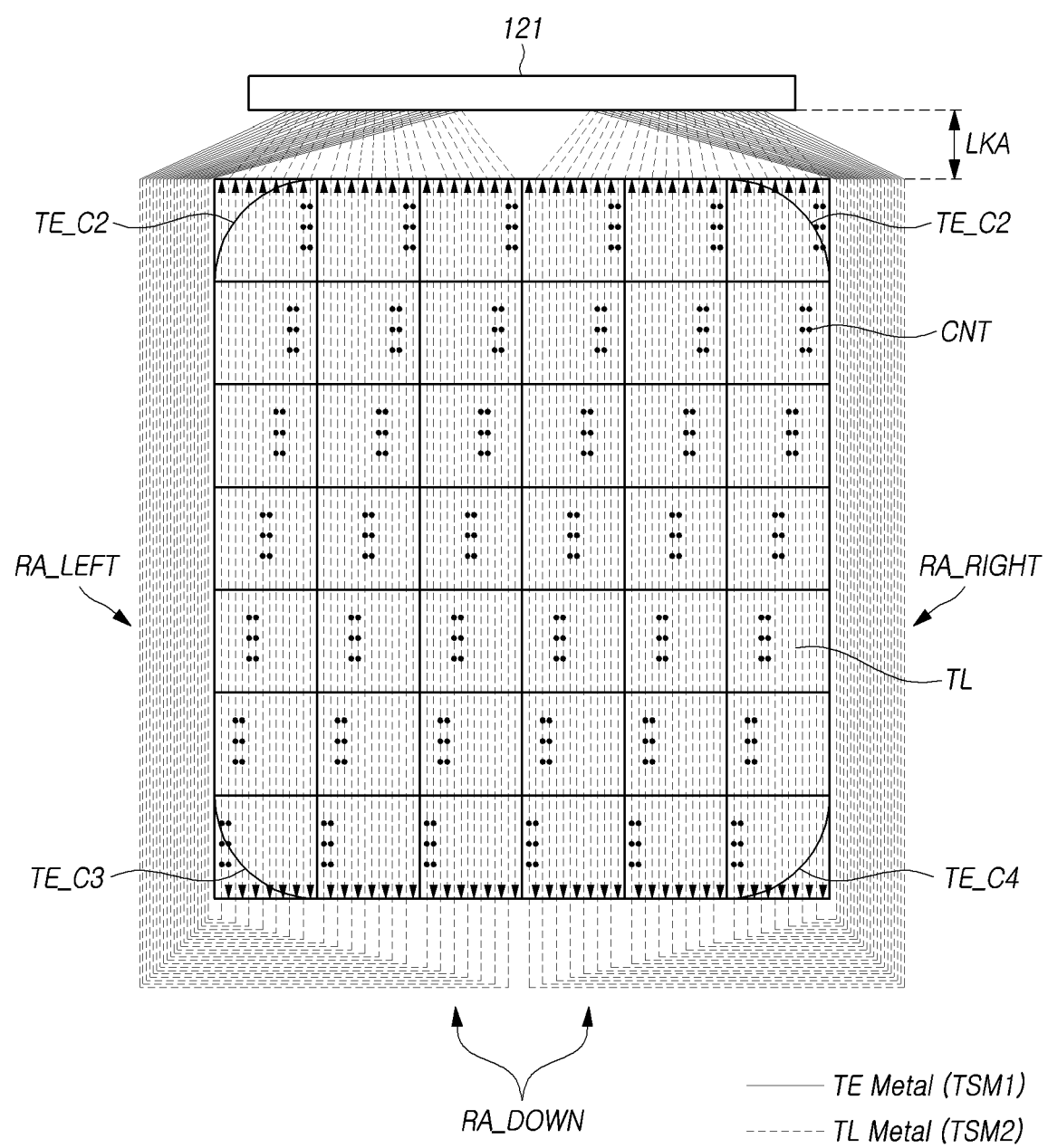
FIG. 13 is a view illustrating the third structure of the touch routing lines of the touch display device according to embodiments of the present disclosure in more detail.
Figure 14:
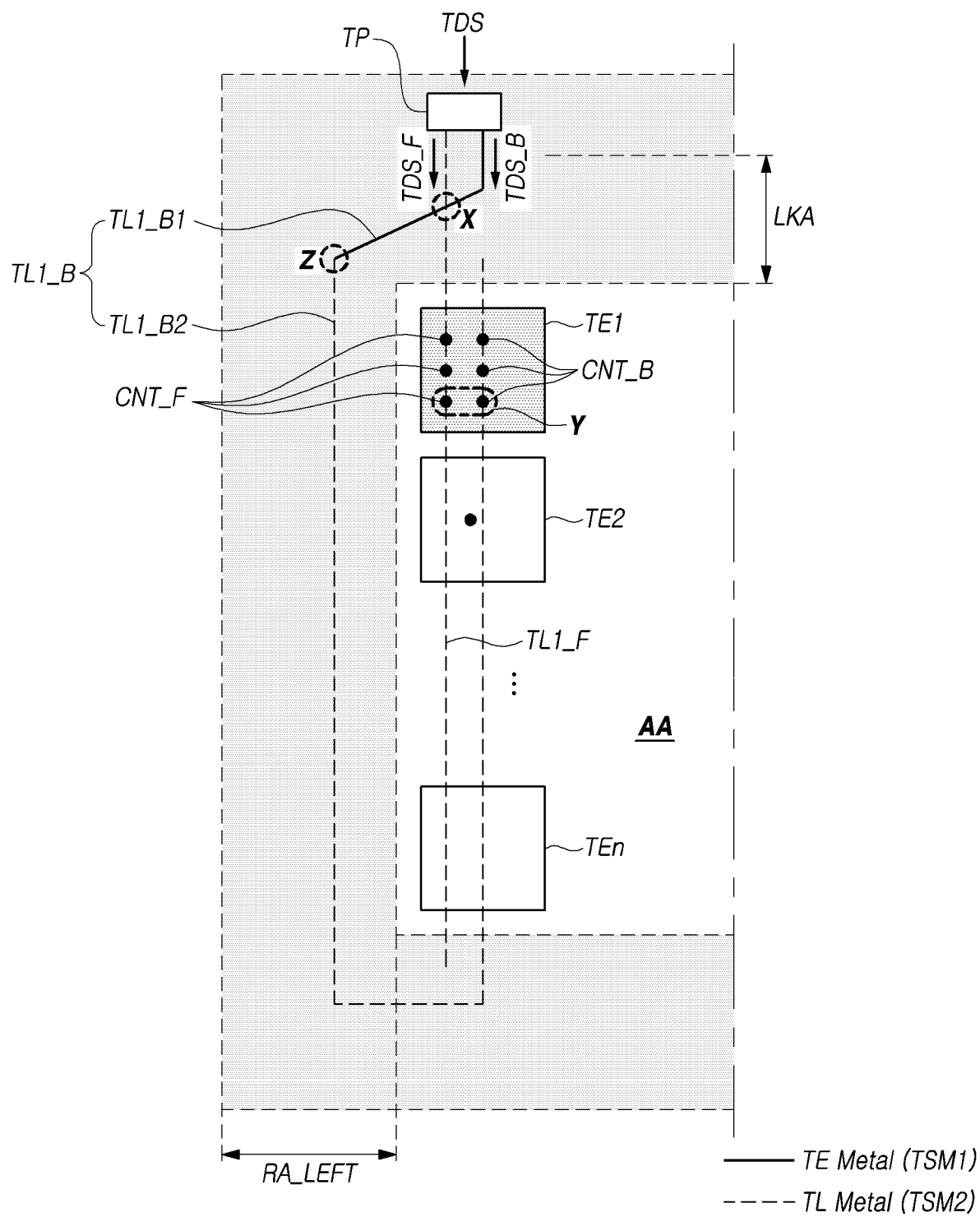
FIG. 14 is a view for describing dual routing that utilizes the third structure of the touch routing lines of the touch display device according to embodiments of the present disclosure.
Figure 15:
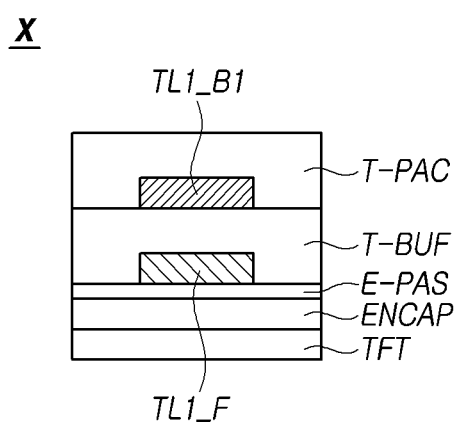
FIG. 15 is a cross-sectional view of an overlapping area under the third structure of the touch routing lines of the touch display device according to embodiments of the present disclosure.
Figure 16:
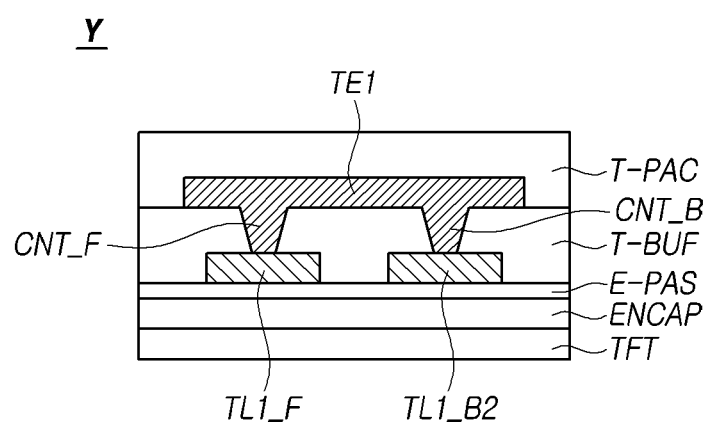
FIG. 16 is a cross-sectional view of a contact area under the third structure of the touch routing lines of the touch display device according to embodiments of the present disclosure.
Figure 17:
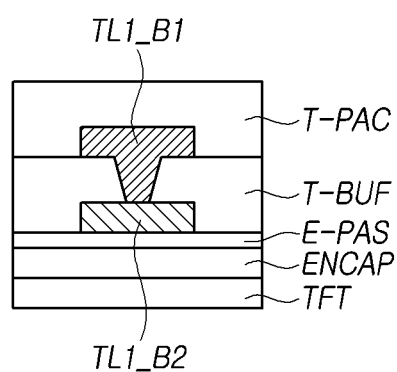
FIG. 17 is a cross-sectional view of a jumping area of the touch routing line under the third structure of the touch routing lines of the touch display device according to embodiments of the present disclosure.

FIG. 12 is a view illustrating the third structure of the touch routing lines TL of the touch display device 100 according to the embodiments of the present disclosure. FIG. 13 is a view illustrating the third structure of the touch routing lines TL of the touch display device 100 according to the embodiments of the present disclosure in more detail. FIG. 14 is a view for describing dual routing that utilizes the third structure of the touch routing lines TL of the touch display device 100 according to the embodiments of the present disclosure. FIG. 15 is a cross-sectional view of an overlapping area X under the third structure of the touch routing lines TL of the touch display device 100 according to the embodiments of the present disclosure. FIG. 16 is a cross-sectional view of a contact area Y under the third structure of the touch routing lines TL of the touch display device 100 according to the embodiments of the present disclosure. FIG. 17 is a cross-sectional view of a jumping area Z of the touch routing line TL under the third structure of the touch routing lines TL of the touch display device 100 according to the embodiments of the present disclosure.

Referring to FIG. 12, when the touch display device 100 according to the embodiments of the present disclosure has the third structure of the touch routing lines TL, the non-active area NA, which is an outer area of the active area AA in the display panel 110, may include a link area LKA located on an upper outer periphery of the active area AA, a left routing area RA_LEFT located on a left outer periphery of the active area AA, a right routing area RA_RIGHT located on a right outer periphery of the active area AA, and a lower routing area RA_DOWN located on a lower outer periphery of the active area AA.

Referring to FIG. 12, when the touch display device 100 according to the embodiments of the present disclosure has the third structure of the touch routing lines TL, a touch driving signal TDS may be redundantly supplied to one touch electrode TE through dual paths (a front line TL1_F and a back line TL1_B).

In other words, referring to FIG. 12, when the touch display device 100 according to the embodiments of the present disclosure has the third structure of the touch routing lines TL, the touch driving circuit 210 of the touch display device 100 may redundantly supply the touch driving signal TDS to one touch electrode TE through the dual paths (the front line TL1_F and the back line TL1_B).

Further, referring to FIG. 12, when the touch display device 100 according to the embodiments of the present disclosure has the third structure of the touch routing lines TL, one touch electrode TE may be sensed through the dual paths (the front line TL1_F and the back line TL1_B).

In other words, referring to FIG. 12, when the touch display device 100 according to the embodiments of the present disclosure has the third structure of the touch routing lines TL, the touch driving circuit 210 of the touch display device 100 may redundantly sense one touch electrode TE through the dual paths (the front line TL1_F and the back line TL1_B).

Referring to FIG. 12, when the touch display device 100 according to the embodiments of the present disclosure has the third structure of the touch routing lines TL, the touch driving circuit 210 may redundantly supply the touch driving signal TDS to one touch electrode TE through the dual paths (the front line TL1_F and the back line TL1_B) and redundantly sense one touch electrode TE through the dual paths. The third structure of the touch routing lines TL for this is referred to as a dual routing structure.

When such a dual routing structure is used, touch sensitivity may be improved, and when a problem (e.g., short circuit or the like) occurs in one of the dual paths (the front line TL1_F and the back line TL1_B), it is possible to drive and sense through the remaining path, thereby enabling normal touch sensing.

Referring to FIGS. 12 to 17, the plurality of touch routing lines TL may include a first touch routing line TL1 electrically connected to any first touch electrode TE1 among the plurality of touch electrodes TE.

Referring to FIGS. 12 to 17, the first touch routing line TL1 may include a front line TL1_F and a back line TL1_B that are branched at a first touch pad TP.

Referring to FIGS. 12 to 17, the front line TL1_F of the first touch routing line TL1 may not bypass the left routing area RA_LEFT or the right routing area RA_RIGHT, located on the left outer periphery or the right outer periphery of the active area AA, may extend directly into the active area AA through the link area LKA located on the upper outer periphery of the active area AA, and may be electrically connected to the first touch electrode TE1 through front contact holes CNT_F in the contact area Y.

Referring to FIGS. 12 to 17, the back line TL1_B may bypass the left routing area RA_LEFT or the right routing area RA_RIGHT, may extend into the active area AA through the lower routing area RA_DOWN located on the lower outer periphery of the active area AA, and may be electrically connected to the first touch electrode TE1 through back contact holes CNT_B in the contact area Y.

Referring to FIGS. 14 to 17, the back line TL1_B of the first touch routing line TL1 may include a first back line TL1_B1 including a first metal and a second back line TL1_B2 including a second metal.

Referring to FIGS. 14 to 17, the front line TL1_F of the first touch routing line TL1 may include the second metal.

The first metal and the second metal may be different metals. The first metal may be the same metal or substantially the same material as the first touch electrode TE1. The second metal may be a metal different from the first touch electrode TE1.

The first touch electrode TE1 and the first back line TL1_B1 may be disposed in the first touch sensor metal layer TSM1. The front line TL1_F and the second back line TL1_B2 may be disposed in the second touch sensor metal layer TSM2.

Referring to FIGS. 14 and 17, the first back line TL1_B1 may be separated from the second back line TL1_B2 by a touch buffer layer T-BUF.

Referring to FIGS. 14 and 17, in the jumping area Z, the first back line TL1_B1 may be electrically connected to the second back line TL1_B2 through a contact hole of the touch buffer layer T-BUF in the non-active area NA.

Referring to FIGS. 14 and 15, the first back line TL1_B1 including the first metal as a portion of the back line TL1_B may overlap the front line TL1_F including the second metal in the line overlapping area Z in the link area LKA.

Referring to FIGS. 15 to 17, an encapsulation layer ENCAP may be disposed on a transistor array TFT, a passivation layer E-PAS may be disposed on the encapsulation layer ENCAP, and a touch sensor structure may be formed on the passivation layer E-PAS.

In FIGS. 15 to 17, the touch buffer layer T-BUF may correspond to the first touch buffer layer T-BUF1 in FIGS. 3A and 3B.

Referring to FIG. 14, through the first touch pad TP, the touch driving circuit 210 may supply a front touch driving signal TDS_F to the front line TL1_F of the first touch routing line TL1 and supply a back touch driving signal TDS_B to the back line TL1_B of the first touch routing line TL1.

Referring to FIG. 14, the front touch driving signal TDS_F and the back touch driving signal TDS_B are signals branched from the touch driving signal TDS that is applied to the first touch pad TP by the touch driving circuit 210.

Referring to FIG. 14, the front touch driving signal TDS_F and the back touch driving signal TDS_B may have the same or equivalent frequency, amplitude, phase, and the like.

Four touch electrodes TE_C1, TE_C2, TE_C3, and TE_C4 located at four corners of the active area AA may have the same shape or substantially the same shape as touch electrodes located at areas other than the four corners, or may have a rounded corner shape as shown in FIGS. 12 and 13.

Figure 18:
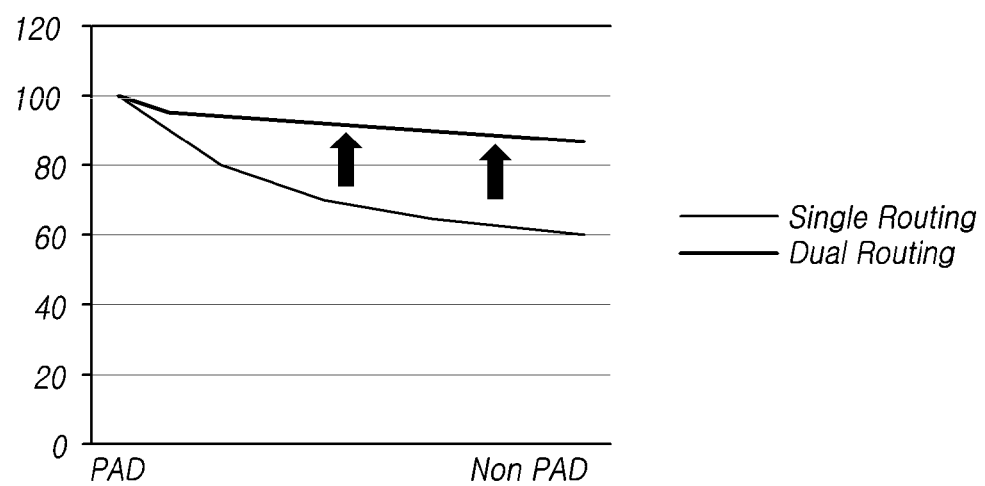
FIG. 18 is a graph illustrating touch sensitivity according to dual routing and single routing of the touch display device according to embodiments of the present disclosure.

FIG. 18 is a graph illustrating touch sensitivity according to the dual routing and the single routing of the touch display device 100 according to the embodiments of the present disclosure.

In the graph of FIG. 18, an x-axis represents positions from where the touch pads are to where the touch pads are not, and a y-axis represents touch sensitivity.

Referring to FIG. 18, it can be seen that when the dual routing is used in which the signal supply and the signal sensing are performed through two paths (dual paths: the front line and the back line) described above, touch sensitivity is improved at most positions compared to the case of using the single routing in which the signal supply and the signal sensing are performed through one path (single path: the front line).

In particular, it can be seen that touch sensitivity for the touch electrode TE located away from the touch pad is greatly improved.

Embodiments of the present disclosure may provide a touch display device including: a substrate having thereon an active area and a non-active area adjacent to the active area, the active area displaying an image, the non-active area including a driving pad area; a transistor disposed on the substrate; a pixel electrode connected to either a source electrode or a drain electrode of the transistor; a common electrode disposed on the pixel electrode; an encapsulation layer disposed on the common electrode, the encapsulation layer having an inclined surface; a first touch sensor metal layer on the encapsulation layer; a plurality of touch electrodes disposed in the first touch sensor metal layer; a plurality of touch pads disposed in the driving pad area in the non-active area; and a plurality of touch routing lines that electrically connect the plurality of touch electrodes to the plurality of touch pads and descend along the inclined surface of the encapsulation layer to extend to the driving pad area while being connected to the plurality of touch electrodes in the active area.

The touch display device according to the embodiments of the present disclosure may further include a plurality of outer switches that are disposed further outward than the driving pad area, do not overlap the inclined surface of the encapsulation layer, and include ends electrically connected to the plurality of touch pads in the driving pad area and the other ends in an electrically floating state.

In the touch display device according to the embodiments of the present disclosure, each of the plurality of outer switches may further include an on-off control terminal to which a control voltage, whose voltage level is not varied, is applied.

In the touch display device according to the embodiments of the present disclosure, the control voltage may be a turn-off level voltage.

The touch display device according to the embodiments of the present disclosure may further include one or more control lines to which the on-off control terminals of the plurality of outer switches are commonly connected.

In the touch display device according to the embodiments of the present disclosure, the one or more control lines may be electrically connected to a gate voltage line to which a turn-off level gate voltage for display driving is applied.

In the touch display device according to the embodiments of the present disclosure, the areas occupied by the plurality of touch electrodes may be equivalent or substantially equivalent to each other.

According to the embodiments of the present disclosure, the touch display device may further include a second touch sensor metal layer located on the encapsulation layer and a first touch buffer layer located on the second touch sensor metal layer.

In the touch display device according to the embodiments of the present disclosure, the first touch sensor metal layer may be located on the first touch buffer layer.

In the touch display device according to the embodiments of the present disclosure, the plurality of touch routing lines may be disposed in the second touch sensor metal layer.

The touch display device according to the embodiments of the present disclosure may further include an additional touch buffer layer located between the encapsulation layer and the second touch sensor metal layer.

In the touch display device according to the embodiments of the present disclosure, the areas occupied by the plurality of touch electrodes may be different from each other.

In the touch display device according to the embodiments of the present disclosure, the area occupied by each of the plurality of touch electrodes may be reduced as it is closer to the driving pad area. The area occupied by each of the plurality of touch electrodes may be reduced as the corresponding touch routing line is shortened.

In the touch display device according to the embodiments of the present disclosure, the plurality of touch routing lines may be disposed in the first touch sensor metal layer together with the plurality of touch electrodes.

The touch display device according to the embodiments of the present disclosure may further include a second touch buffer layer located between the encapsulation layer and the first touch sensor metal layer.

The touch display device according to the embodiments of the present disclosure may further include a plurality of display column lines and a plurality of display row lines for display driving.

The plurality of touch electrodes may include a first touch electrode and a second touch electrode disposed in the same touch electrode column.

Two or more display column lines overlapping the first touch electrode may be the same as two or more display column lines overlapping the second touch electrode.

Two or more display row lines overlapping the first touch electrode may be different from two or more display row lines overlapping the second touch electrode.

In the touch display device according to the embodiments of the present disclosure, each of the plurality of touch routing lines may overlap at least one of the plurality of touch electrodes, and each of the plurality of touch routing lines may be disposed in a either column direction or a row direction.

In the touch display device according to the embodiments of the present disclosure, when each of the plurality of touch routing lines is disposed in the row direction, the plurality of touch routing lines may bypass either a left routing area in the non-active area located adjacent to a left outer periphery of the active area or a right routing area in the non-active area located adjacent to a right outer periphery of the active area, and the plurality of touch routing lines extend to the driving pad area of the non-active area, located on an upper end of a link area located on an upper outer periphery of the active area, through the link area.

In the touch display device according to the embodiments of the present disclosure, the plurality of touch routing lines may include a first touch routing line electrically connected to any first touch electrode among the plurality of touch electrodes, and the first touch routing line may include a front line and a back line that are branched at a first touch pad.

In the touch display device according to the embodiments of the present disclosure, the front line may not bypass the left routing area or the right routing area, located on the left outer periphery or the right outer periphery of the active area, may extend directly into the active area through the link area located on the upper outer periphery of the active area, and may be electrically connected to the first touch electrode through front contact holes.

In the touch display device according to the embodiments of the present disclosure, the back line may bypass the left routing area or the right routing area, may extend into the active area through a lower routing area located on a lower outer periphery of the active area, and may be electrically connected to the first touch electrode through back contact holes.

In the touch display device according to the embodiments of the present disclosure, the back line may include a first back line including a first metal and a second back line including a second metal, and the front line may include the second metal.

In the touch display device according to the embodiments of the present disclosure, the first metal may be the same metal or substantially the same metal as the first touch electrode, and the second metal may be a metal different from the first touch electrode.

In the touch display device according to the embodiments of the present disclosure, the first back line may be separated from the second back line by a touch buffer layer, and the first back line may be electrically connected to the second back line through a contact hole of the touch buffer layer in the non-active area.

The touch display device according to the embodiments of the present disclosure may further include a touch driving circuit configured to drive the plurality of touch electrodes. Through the first touch pad, the touch driving circuit may supply a front touch driving signal to the front line of the first touch routing line and supply a back touch driving signal to the back line of the first touch routing line.

In the touch display device according to the embodiments of the present disclosure, the front touch driving signal may be equivalent to the back touch driving signal in frequency, amplitude, phase, and the like.

Embodiments of the present disclosure may provide a touch display device including: a substrate; a transistor disposed on the substrate; a pixel electrode connected to at least one of a source electrode or a drain electrode of the transistor; a common electrode disposed above the pixel electrode; an encapsulation layer disposed on the common electrode; a plurality of touch electrodes located above the encapsulation layer and disposed in an active area; a plurality of touch pads disposed in a driving pad area in a non-active area that is an outer area of the active area; and a plurality of touch routing lines that electrically connect the plurality of touch electrodes to the plurality of touch pads and descend along an inclined surface of the encapsulation layer to extend to the driving pad area while being connected to the plurality of touch electrodes in the active area.

The touch display device according to the embodiments of the present disclosure may further include a plurality of outer switches spaced apart from the driving pad area.

In the touch display device according to the embodiments of the present disclosure, the plurality of touch electrodes may be grouped into K test groups, and K may be a natural number that is greater than one.

The touch display device according to the embodiments of the present disclosure may further include K test lines respectively corresponding to the K test groups, and K test pads that are electrically connected to the K test lines and are disposed in a test pad area located further outward than the driving pad area.

In the touch display device according to the embodiments of the present disclosure, the plurality of touch pads may include two or more touch pads electrically connected to two or more touch electrodes included in any first test group among the K test groups.

In the touch display device according to the embodiments of the present disclosure, one end of each of two or more outer switches among the plurality of outer switches may be electrically connected to each of the two or more touch pads in a corresponding manner, the other end of each of the two or more outer switches among the plurality of outer switches may be electrically connected to a first test line corresponding to the first test group among the K test lines in common, and an on-off control terminal of each of the two or more outer switches among the plurality of outer switches may be electrically connected to a control line in common.

The touch display device according to the embodiments of the present disclosure may further include a test switch configured to connect one of a test node to which a turn-on level voltage is applied and a normal node to which a turn-off level voltage is applied to the control line.

In the touch display device according to the embodiments of the present disclosure, when a test start event for two or more touch electrodes included in the first test group is generated, the test node may be connected to the control line by the test switch, and the turn-on level voltage may be applied to a gate node of each of the two or more outer switches.

In the touch display device according to the embodiments of the present disclosure, when a test end event for the two or more touch electrodes included in the first test group is generated, the normal node is connected to the control line by the test switch, and the turn-off level voltage may be applied to the gate node of each of the two or more outer switches.

According to the embodiments of the present disclosure, a touch display device capable of enabling efficient testing and reducing the number of test pads may be provided.

Further, according to the embodiments of the present disclosure, a touch display device having a touch sensor structure capable of enabling efficient testing and reducing the number of test pads, and also improving touch sensitivity may be provided.

The above description has been presented to enable any person skilled in the art to make and use the technical idea of the present disclosure, and has been provided in the context of a particular application and its requirements. Various modifications, additions, and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown. All technical ideas within the scope of equivalents thereof should be construed as being included within the scope of the present disclosure.

The various embodiments described above can be combined to provide further embodiments. Other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A touch display device, comprising:
   a substrate having thereon an active area and a non-active area adjacent to the active area, the active area displaying an image, the non-active area including a driving pad area, the active area having a first side and a second side opposite the second side, a third side between the first and the second sides;
   a transistor disposed on the substrate;
   a pixel electrode connected to either a source electrode or a drain electrode of the transistor;
   a common electrode disposed on the pixel electrode;
   an encapsulation layer disposed on the common electrode, the encapsulation layer having an inclined surface;
   a first touch sensor metal layer on the encapsulation layer;
   a plurality of touch electrodes disposed in the first touch sensor metal layer, the plurality of touch electrodes including a first group of touch electrodes arranged in a first direction, the first group of touch electrodes including a first touch electrode;

a plurality of touch pads disposed on the driving pad area in the non-active area;
a plurality of touch routing lines that electrically connect the plurality of touch electrodes to the plurality of touch pads and descend along the inclined surface of the encapsulation layer to extend to the driving pad area while being connected to the plurality of touch electrodes in the active area, the plurality of touch routing lines including a front line and a back line electrically connected to the first touch electrode of the first group of touch electrodes arranged in the first direction, the front line extending towards the first side of the active area to electrically connect to the first touch electrode, the back line bypassing an entire active area along the non-active area at a periphery of the third side of the active area, the back line extending towards the first touch electrode from the second side of the active area; and
a plurality of outer switches that are disposed further outward than the driving pad area, do not overlap the inclined surface of the encapsulation layer, and include one end electrically connected to the plurality of touch pads in the driving pad area and the other end in an electrically floating state.

2. The touch display device of claim 1, wherein each of the plurality of outer switches further includes an on-off control terminal to which a control voltage, whose voltage level is not varied, is applied.

3. The touch display device of claim 2, wherein the control voltage is a turn-off level voltage.

4. He touch display device of claim 3, further comprising:
one or more control lines to which the on-off control terminals of the plurality of outer switches are commonly connected,
wherein the one or more control lines are electrically connected to a gate voltage line to which a turn-off level gate voltage for display driving is applied.

5. The touch display device of claim 1, further comprising:
a plurality of display column lines and a plurality of display row lines for display driving, wherein the plurality of touch electrodes include a second touch electrode and a third touch electrode disposed in the same touch electrode column;
two or more display column lines overlapping the second touch electrode are the same as two or more display column lines overlapping the third touch electrode; and
two or more display row lines overlapping the second touch electrode are different from two or more display row lines overlapping the third touch electrode.

6. A touch display device, comprising:
a substrate having thereon an active area and a non-active area adjacent to the active area, the active area displaying an image, the non-active area including a driving pad area;
a transistor disposed on the substrate;
a pixel electrode connected to either a source electrode or a drain electrode of the transistor;
a common electrode disposed on the pixel electrode;
an encapsulation layer disposed on the common electrode, the encapsulation layer having an inclined surface;
a first touch sensor metal layer on the encapsulation layer;
a plurality of touch electrodes disposed in the first touch sensor metal layer;
a plurality of touch pads disposed on the driving pad area in the non-active area;
a plurality of touch routing lines that electrically connect the plurality of touch electrodes to the plurality of touch pads and descend along the inclined surface of the encapsulation layer to extend to the driving pad area while being connected to the plurality of touch electrodes in the active area; and
a plurality of outer switches that are disposed further outward than the driving pad area, do not overlap the inclined surface of the encapsulation layer, and include one end electrically connected to the plurality of touch pads in the driving pad area and the other end in an electrically floating state,
wherein
the plurality of touch routing lines include a first touch routing line electrically connected to any first touch electrode among the plurality of touch electrodes;
wherein the first touch routing line includes a front line and a back line that are branched at a first touch pad;
wherein the front line bypasses a left routing area or a right routing area, located on a left outer periphery or a right outer periphery of the active area and extends directly into the active area through a link area located on an upper outer periphery of the active area, and is electrically connected to the first touch electrode through a front contact hole; and
wherein the back line enters the left routing area or the right routing area and extends into the active area through a lower routing area located on a lower outer periphery of the active area, and is electrically connected to the first touch electrode through a back contact hole.

7. The touch display device of claim 6, wherein
the back line includes a first back line including a first metal and a second back line including a second metal;
the front line includes the second metal;
the first metal is substantially the same metal as the first touch electrode; and
the second metal is a metal different from the first touch electrode.

8. The touch display device of claim 6, wherein
the first back line is separated from the second back line by a touch buffer layer; and
the first back line is electrically connected to the second back line through a contact hole of the touch buffer layer in the non-active area.

9. The touch display device of claim 6, further comprising:
a touch driving circuit configured to drive the plurality of touch electrodes, wherein, through the first touch pad, the touch driving circuit supplies a front touch driving signal to the front line of the first touch routing line and supplies a back touch driving signal to the back line of the first touch routing line; and
the front touch driving signal is equivalent to the back touch driving signal with respect to frequency, amplitude, and phase.

* * * * *